(12) United States Patent
Yoo et al.

(10) Patent No.: US 12,408,441 B2
(45) Date of Patent: Sep. 2, 2025

(54) METHODS OF MANUFACTURING SEMICONDUCTOR DEVICES

(71) Applicant: Samsung Electronics Co., Ltd., Suwon-si (KR)

(72) Inventors: Seonghyun Yoo, Seoul (KR); Yeonga Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 480 days.

(21) Appl. No.: 18/055,357

(22) Filed: Nov. 14, 2022

(65) Prior Publication Data

US 2023/0154797 A1    May 18, 2023

(30) Foreign Application Priority Data

Nov. 17, 2021    (KR) .................. 10-2021-0158391

(51) Int. Cl.
    *H10D 89/00*    (2025.01)
    *H01L 21/02*    (2006.01)
    *H01L 23/00*    (2006.01)

(52) U.S. Cl.
    CPC ..... *H10D 89/011* (2025.01); *H01L 21/02348* (2013.01); *H01L 24/02* (2013.01); *H01L 2224/0231* (2013.01)

(58) Field of Classification Search
    CPC .. H10D 89/011; H01L 21/02348; H01L 24/02
    See application file for complete search history.

(56) References Cited

U.S. PATENT DOCUMENTS

| | | | |
|---|---|---|---|
| 9,716,010 B2 | 7/2017 | Gambino et al. | |
| 9,716,023 B2 | 7/2017 | Farrens et al. | |
| 10,872,802 B2 | 12/2020 | Chang et al. | |
| 2013/0048224 A1 | 2/2013 | George et al. | |
| 2014/0318697 A1 | 10/2014 | Tan et al. | |
| 2019/0109034 A1 | 4/2019 | Fehkuhrer | |
| 2019/0165037 A1* | 5/2019 | Chae ................... | H10H 20/835 |

FOREIGN PATENT DOCUMENTS

| | | |
|---|---|---|
| JP | 2008060361 A | 3/2008 |
| KR | 101392133 B1 | 5/2014 |
| KR | 101617316 B1 | 5/2016 |

* cited by examiner

*Primary Examiner* — Mohammad M Choudhry
(74) *Attorney, Agent, or Firm* — Wolf, Greenfield & Sacks, P.C.

(57) ABSTRACT

A method of manufacturing a semiconductor device includes forming a light blocking film configured to block first light within a first wavelength band on an edge region of an upper surface of a light-transmitting carrier substrate; forming a photosensitive adhesive layer on the upper surface of the light-transmitting carrier substrate to at least partially cover the light blocking film; bonding a product substrate to the upper surface of the light-transmitting carrier substrate using the photosensitive adhesive layer; partially curing the photosensitive adhesive layer by irradiating the light through the light-transmitting carrier substrate, wherein a portion of the photosensitive adhesive layer overlapping the light blocking film is not cured; processing the product substrate to form a plurality of semiconductor devices after the partially curing of the photosensitive adhesive layer; and cutting the product substrate such that the plurality of semiconductor devices are cut into a plurality of separate individual semiconductor devices.

20 Claims, 22 Drawing Sheets

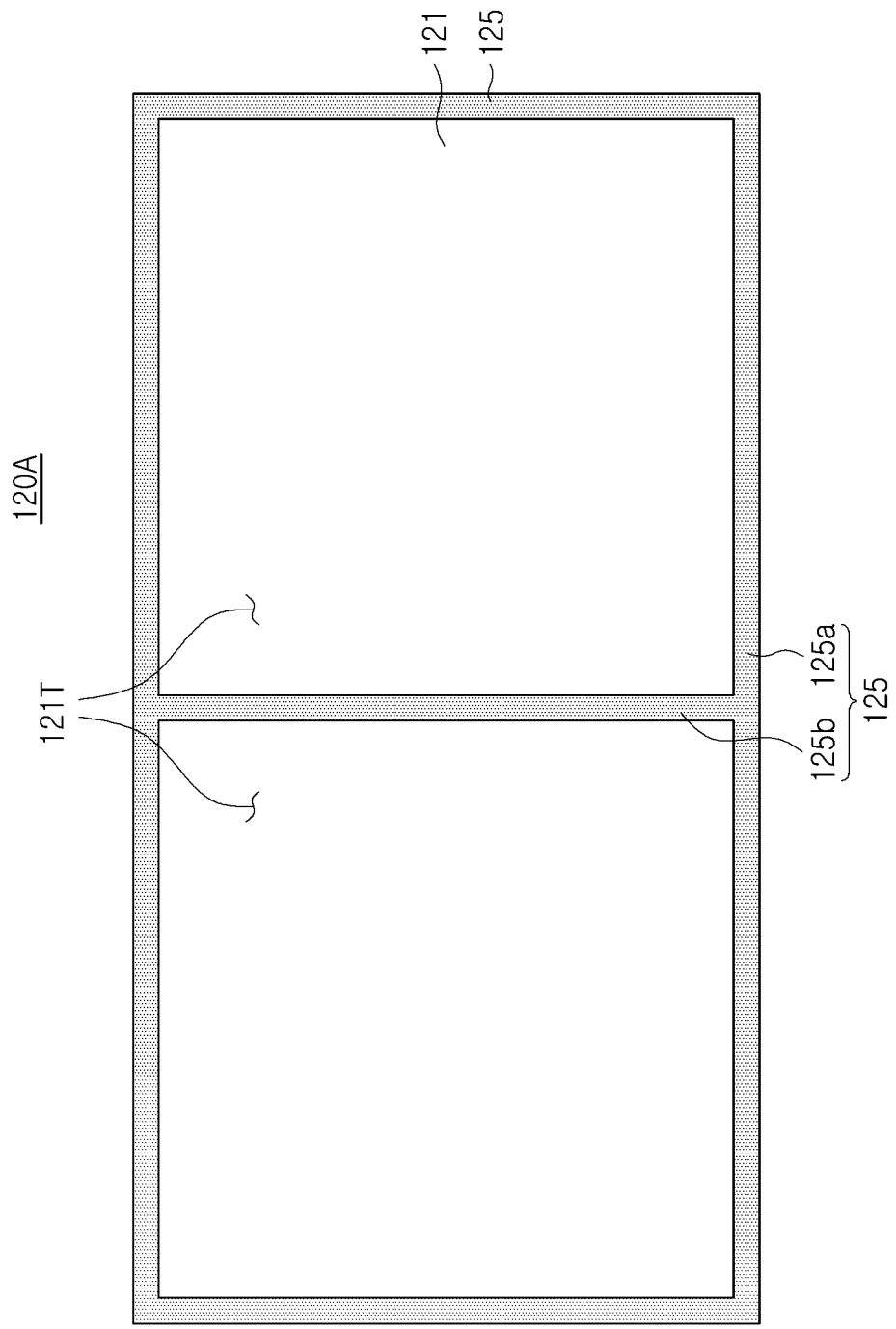

METHODS OF MANUFACTURING SEMICONDUCTOR DEVICES

CROSS-REFERENCE TO RELATED APPLICATION(S)

This application claims benefit of priority to Korean Patent Application No. 10-2021-0158391 filed on Nov. 17, 2021, in the Korean Intellectual Property Office, the disclosure of which is incorporated herein by reference in its entirety.

BACKGROUND

The present disclosure relates to methods of manufacturing semiconductor devices.

In general, in a process of manufacturing a semiconductor device (e.g., a semiconductor package), a carrier substrate for supporting a product substrate may be used in order to suppress occurrence of warpage of the product substrate. As an adhesive layer between the product substrate and the carrier substrate, an energy-curable resin (e.g., an epoxy based film) such as a thermosetting resin may be used. However, there may be a problem in that a portion fixed by the adhesive layer during the process could be damaged, or in a detachment process from the product substrate, a complicated subsequent process may be required to remove an adhesive remaining on the product substrate.

SUMMARY

An aspect of the present disclosure is to provide a method of manufacturing a semiconductor device that includes easily detaching a carrier substrate from a product substrate.

According to an aspect of the present disclosure, a method of manufacturing a semiconductor device comprises forming a light blocking film configured to block first light within a first wavelength band on an edge region of an upper surface of a light-transmitting carrier substrate; forming a photosensitive adhesive layer on the upper surface of the light-transmitting carrier substrate to at least partially cover the light blocking film; bonding a product substrate to the upper surface of the light-transmitting carrier substrate using the photosensitive adhesive layer; partially curing the photosensitive adhesive layer by irradiating the first light through the light-transmitting carrier substrate, wherein a portion of the photosensitive adhesive layer overlapping the light blocking film is not cured; processing the product substrate to form a plurality of semiconductor devices, after the partially curing of the photosensitive adhesive layer; and cutting the product substrate such that the plurality of semiconductor devices are cut into a plurality of separate individual semiconductor devices.

According to an aspect of the present disclosure, a method of manufacturing a semiconductor device comprises forming a light blocking film blocking first light having a first wavelength on an edge region of an upper surface of a light-transmitting carrier substrate, the light blocking film having a first width; forming a photosensitive adhesive layer curable by the first light on the upper surface of the light-transmitting carrier substrate to at least partially cover the light blocking film; bonding a product substrate to the upper surface of the light-transmitting carrier substrate using the photosensitive adhesive layer; partially curing the photosensitive adhesive layer by irradiating the first light through the light-transmitting carrier substrate, wherein a portion of the photosensitive adhesive layer overlapping the light blocking film is not cured, and adheres to the product substrate; processing the product substrate to form a plurality of semiconductor devices after the partially curing of the photosensitive adhesive layer, wherein the product substrate has a dummy region surrounding the plurality of semiconductor devices, the dummy region having a second width equal to or wider than the first width; and cutting the plurality of semiconductor devices together with the product substrate, wherein the portion of the photosensitive adhesive layer overlapping the light blocking film is removed in the cutting.

According to an aspect of the present disclosure, a method of manufacturing a semiconductor device comprises forming a light blocking film configured to block first light within a first wavelength band on an edge region of an upper surface of a light-transmitting carrier substrate; forming a photosensitive adhesive layer on the upper surface of the light-transmitting carrier substrate to at least partially cover the light blocking film; bonding a product substrate to the upper surface of the light-transmitting carrier substrate using the photosensitive adhesive layer; partially curing the photosensitive adhesive layer by irradiating the first light through the light-transmitting carrier substrate, wherein a portion of the photosensitive adhesive layer overlapping the light blocking film is not cured, but adheres to the product substrate; processing the product substrate to form a plurality of semiconductor devices after the partially curing of the photosensitive adhesive layer; attaching adhesive tape to an upper surface of the product substrate on which the plurality of semiconductor devices are formed; curing the portion of the photosensitive adhesive layer overlapping the light blocking film by irradiating second light having a second wavelength that is different from the first wavelength through the light blocking film; and detaching the product substrate from the light-transmitting carrier substrate.

BRIEF DESCRIPTION OF DRAWINGS

The above and other aspects, features, and advantages of the present disclosure will be more clearly understood from the following detailed description, taken in conjunction with the accompanying drawings, in which:

FIGS. 7A to 7D are plan views illustrating a carrier structure according to various embodiments of the present disclosure.

DETAILED DESCRIPTION

Hereinafter, an embodiment of the present disclosure will be described in detail with reference to the accompanying drawings.

Figure 1:
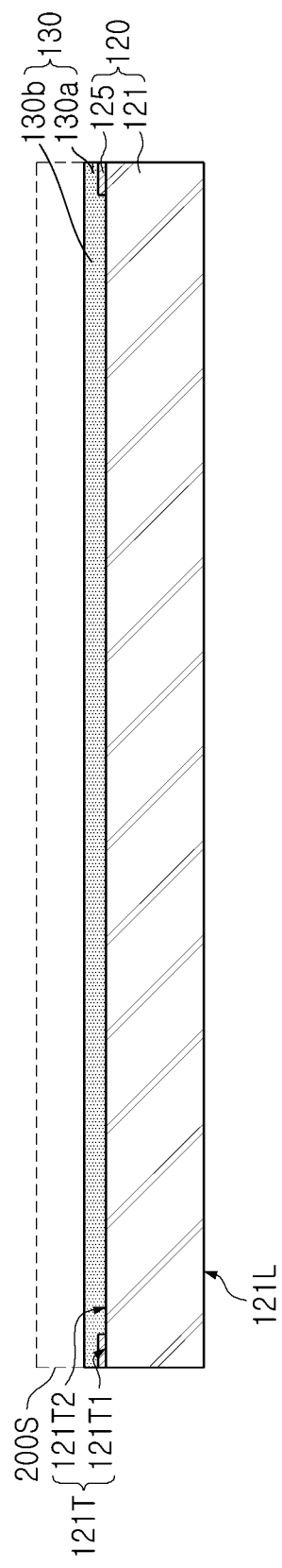
FIG. 1 is a cross-sectional view illustrating a carrier structure according to an embodiment of the present disclosure.
Figure 2:
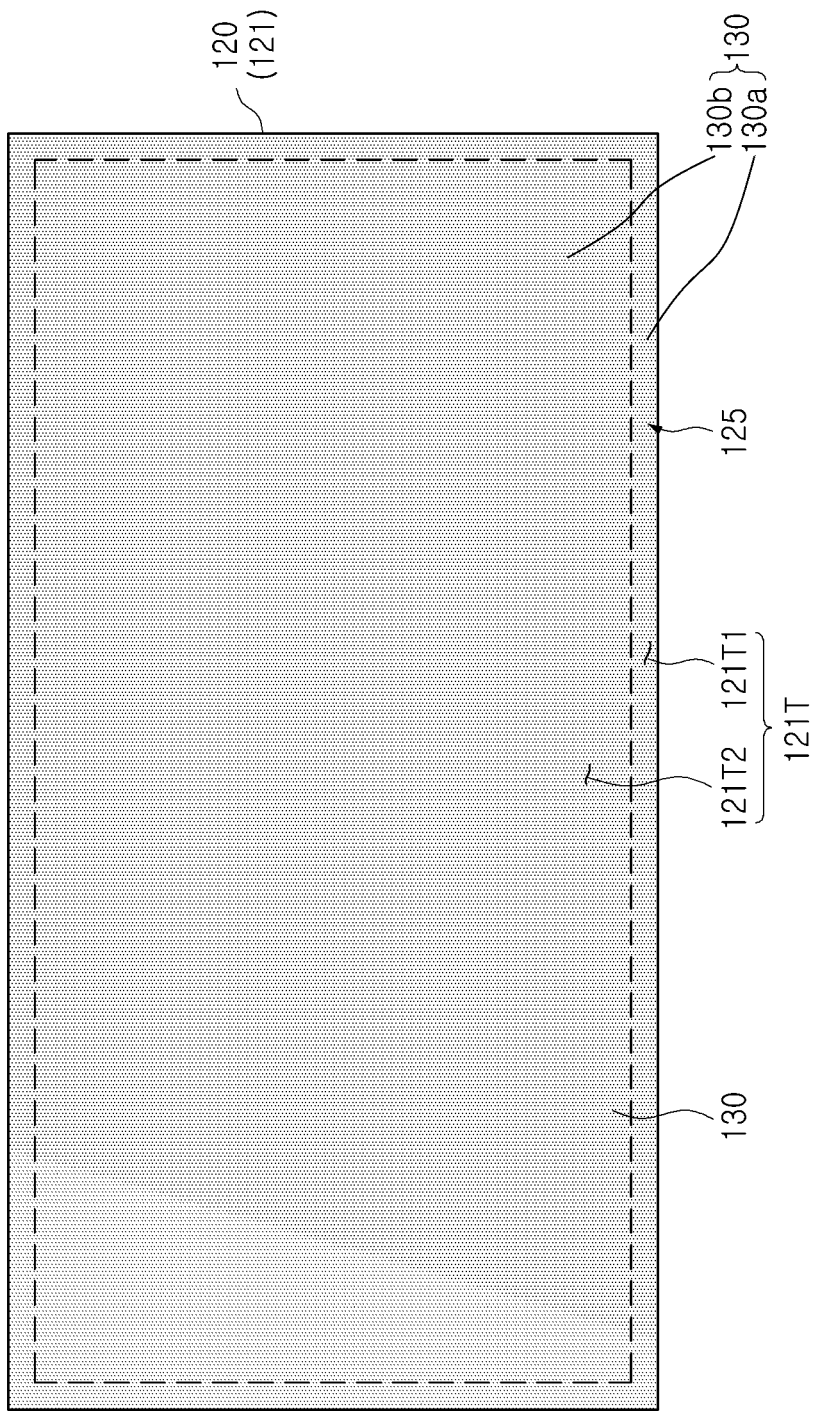
FIG. 2 is a plan view illustrating the carrier structure of FIG. 1.

FIG. 1 is a cross-sectional view illustrating a carrier structure according to an embodiment of the present disclosure, and FIG. 2 is a plan view illustrating the carrier structure of FIG. 1.

Referring to FIGS. 1 and 2, a carrier structure 120 according to the present embodiment may include a light-transmitting carrier substrate 121, and a light blocking film 125 on an edge region 121T1 of an upper surface 121T of the light-transmitting carrier substrate 121. The upper surface 121T of the light-transmitting carrier substrate may also have an inner region 121T2. A photosensitive adhesive layer 130 may be on an upper surface of the carrier structure 120 to at least partially cover the light blocking film.

The carrier structure 120 may be used as a temporary support for supporting a product substrate 200S (indicated by a dotted line) to manufacture a semiconductor device (e.g., a semiconductor package) during a subsequent processing operation. In some embodiments, the product substrate 200S may be a panel or a wafer for a plurality of semiconductor packages. The carrier structure 120 employed in the present embodiment has been illustrated in a form having a rectangular shape corresponding to a shape of the product substrate 200S, to support the product substrate 200S, which may be a rectangular panel, but the present disclosure is not limited thereto. In other embodiments, the carrier structure 120 and may also have a corresponding circular shape for supporting the product substrate 200S, which may be a wafer (see FIG. 8).

The photosensitive adhesive layer 130 may include a photosensitive adhesive resin that may be at least partially cured by irradiating light (e.g., ultraviolet light) of a specific wavelength band such that adhesive force maintained during a processing process is lost or weakened. For example, the photosensitive adhesive layer 130 may include photosensitive polyimide (PSPI).

The light-transmitting carrier substrate 121 may be a substrate capable of transmitting light having a wavelength for at least partially curing the photosensitive adhesive layer 130. For example, the light-transmitting carrier substrate 121 may be a glass substrate. The light blocking film 125 may be a pattern of a material capable of blocking some or all of first light having a first wavelength (e.g., Ultraviolet A (UV-A) or Ultraviolet B (UV-B)). The first wavelength may be within a wavelength band for at least partially curing the photosensitive adhesive layer 130. For example, the first light may be light in a UV-A band (e.g., 320 nanometers (nm) to 400 nm) or light in a UV-B band (e.g., 280 nm to 320 nm).

The photosensitive adhesive layer 130 may include a first portion 130a located on the light blocking film 125, and a second portion 130b located in a region of the upper surface of the light-transmitting carrier substrate 121 surrounded by the light blocking film 125. It will be understood that "an element A surrounds an element B" (or similar language) as used herein means that the element A is at least partially around the element B but does not necessarily mean that the element A completely encloses the element B. The light blocking film 125 may be configured to block the first light for curing the photosensitive adhesive layer 130. For example, the light blocking film 125 may be a metal material or a polymer material, and in some embodiments, may include a wavelength selective blocking/transmitting material.

When the first light is irradiated onto a lower surface 121L of the light-transmitting carrier substrate 121, the first portion 130a of the photosensitive adhesive layer 130 may maintain adhesive force due to blocking of the first light by the light blocking film 125, and the second portion 130b of the photosensitive adhesive layer 130 may be cured by irradiation of the first light to lose or weaken adhesive force.

Since the first portion 130a of the photosensitive adhesive layer 130 may be adhered to the edge region 121T1 of the product substrate 200S, the product substrate 200S may be stably supported on the carrier substrate 121 even with a relatively small contact area during a subsequent processing operation. The product substrate 200S may have a dummy region surrounding one or more regions of a plurality of semiconductor devices to be manufactured from the product substrate 200S, and the light blocking film 125 may have a width equal to or narrower than a width of the dummy region (see FIG. 3B). This dummy region may be provided as a clamping region for handling the product substrate 200S during a subsequent processing operation. For example, the width of the light blocking film 125 may be in a range of 5 millimeters (mm) to 30 mm in some embodiments.

According to the present embodiment, a portion (e.g., 130b) of the photosensitive adhesive layer 130 to be cured which contacts one or more of the regions of the plurality of semiconductor devices (i.e., the semiconductor packages) of the product substrate 200S may have weak or virtually absent adhesive force. Therefore, damage due to mechanical impact in a subsequent processing operation, contamination due to residual adhesive material after detachment, or the like may be effectively prevented.

Figure 7B:
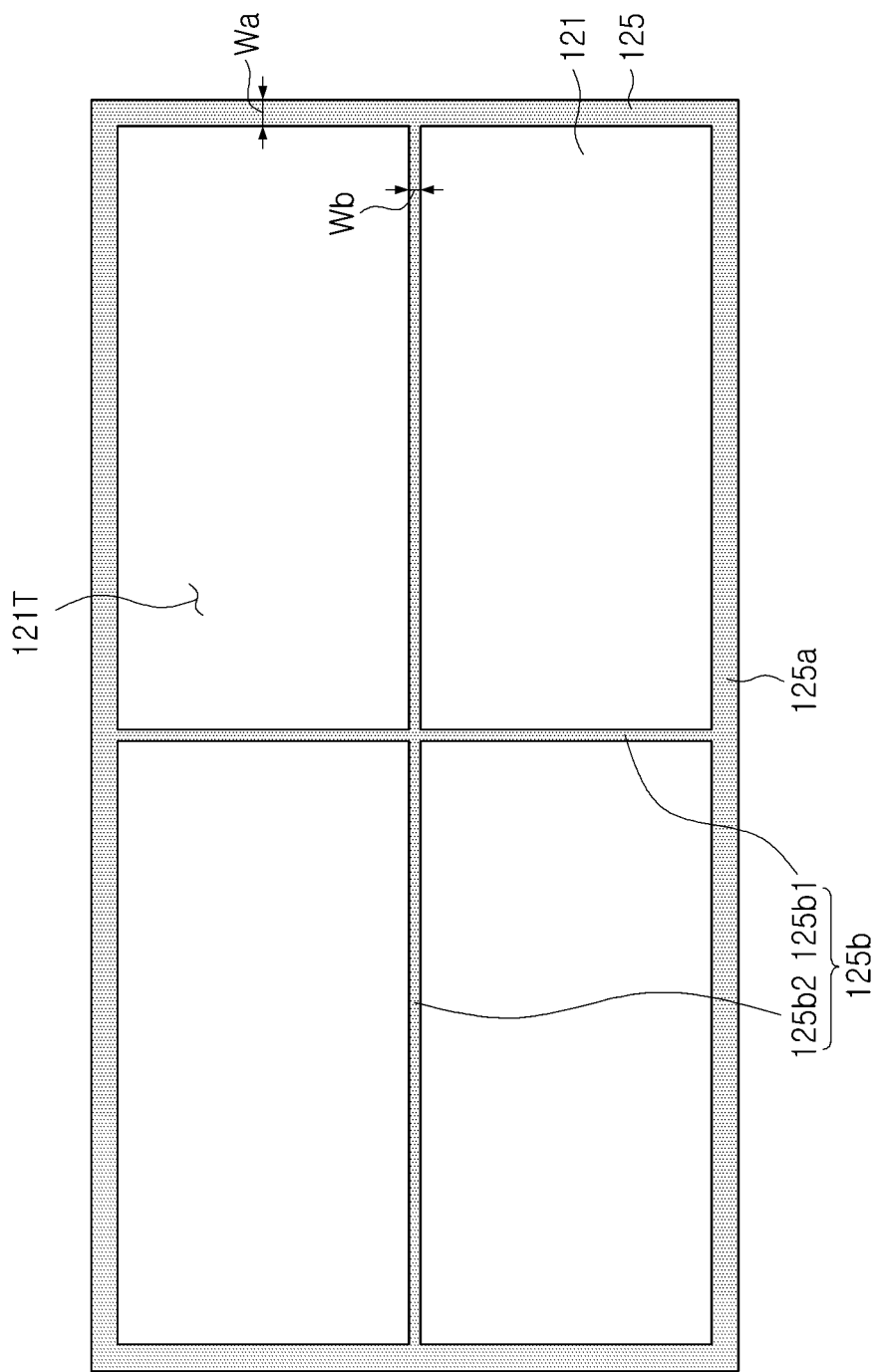
Figure 7C:
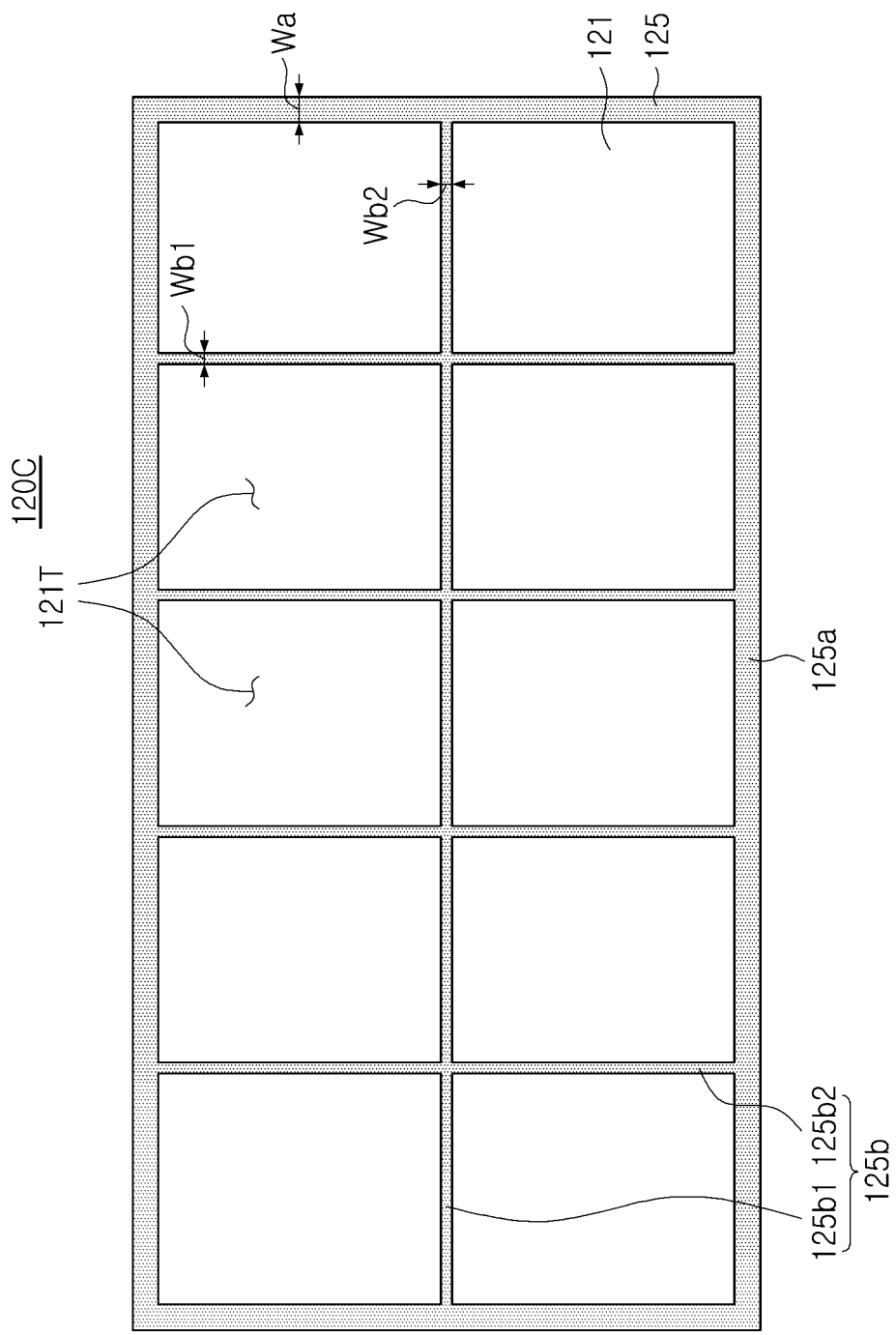
Figure 7D:
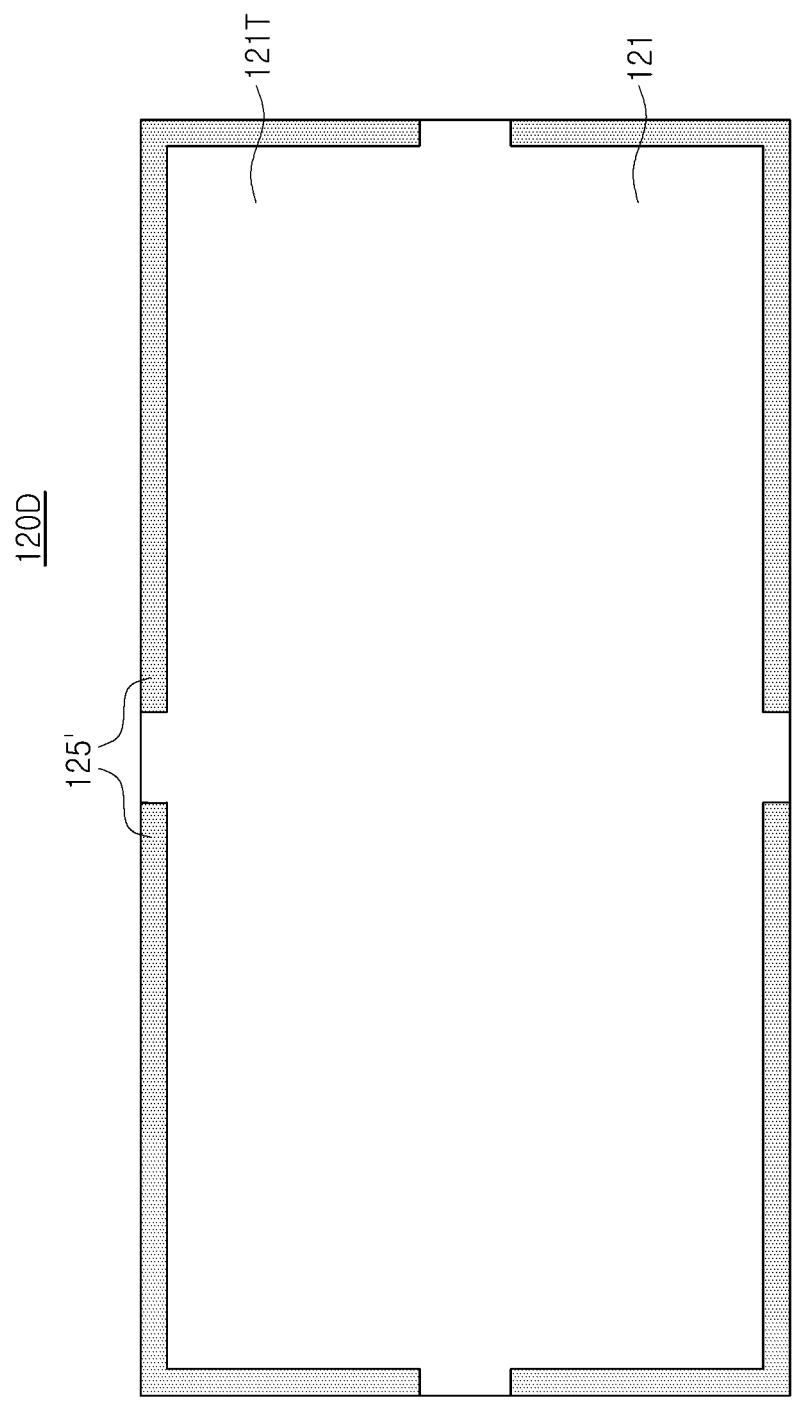

In the present embodiment, although the light blocking film 125 is illustrated to be formed of only an edge pattern continuously surrounding the edge region, the light blocking film 125 may further include a pattern extending into the inner region 121T2 (please refer to FIGS. 7A to 7C) or the edge region, or may include other types of edge patterns non-continuously surrounding the edge region (see FIG. 7D).

In some embodiments, the light blocking film 125 may be configured to pass second light having a second wavelength therethrough, wherein the second wavelength is different from the first wavelength. The second wavelength may be within a wavelength band (e.g., an ultraviolet band) capable of at least partially curing the photosensitive adhesive layer 130. When the second light is irradiated onto the lower surface 121L of the light-transmitting carrier substrate 121 after the subsequent processing operation is completed, the second light may pass through the light-blocking film 125 to be irradiated onto the first portion 130a of the photosensitive adhesive layer 130. Therefore, the first portion 130a may be at least partially cured similarly to the second portion 130b to lose or weaken adhesive force. As a result, the product substrate 200S may be easily detached from the carrier structure 120.

The photosensitive adhesive layer 130 may be a bonding layer curable by ultraviolet light of UV-A or UV-B band. In an embodiment, the light blocking film 125 may be configured to selectively block first light of the UV-A band (e.g., 320 nm to 400 nm), and may be configured to selectively pass second light of the UV-B band (e.g., 280 nm to 320 nm) therethrough. The light blocking film 125 may include, for example, butylmethoxydibenzoylmethane, dibenzoylmethane, oxybenzone, benzophenone-3, benzophenone-8, mexoryl-SX, phenylbenzimidazole sulfonic acid (PSA), or avobenzone. In another embodiment, the light blocking film 125 may be configured to selectively block first light of the UV-B band (e.g., 280 nm to 320 nm), and may be configured to selectively pass second light of the UV-A band (e.g., 320 nm to 400 nm) therethrough. The light blocking film 125 may include, for example, octocrylene, para-aminobenzoic acid, octyl methoxycinnamate, octyl salicylate, or ethylhexyl triazone.

As such, a detachment process of the product substrate 200S may be implemented by UV irradiation of the first portion 130a using the light blocking film 125 (please refer to FIG. 6A), but the present disclosure is not limited thereto. The product substrate 200S may be also implemented by removing the first portion in a cutting process for forming a separate individual semiconductor device (see FIG. 5E).

Hereinafter, a method of manufacturing a semiconductor device (or a semiconductor package) using the carrier structure illustrated in FIGS. 1 and 2 will be described in detail.

Figure 3A:
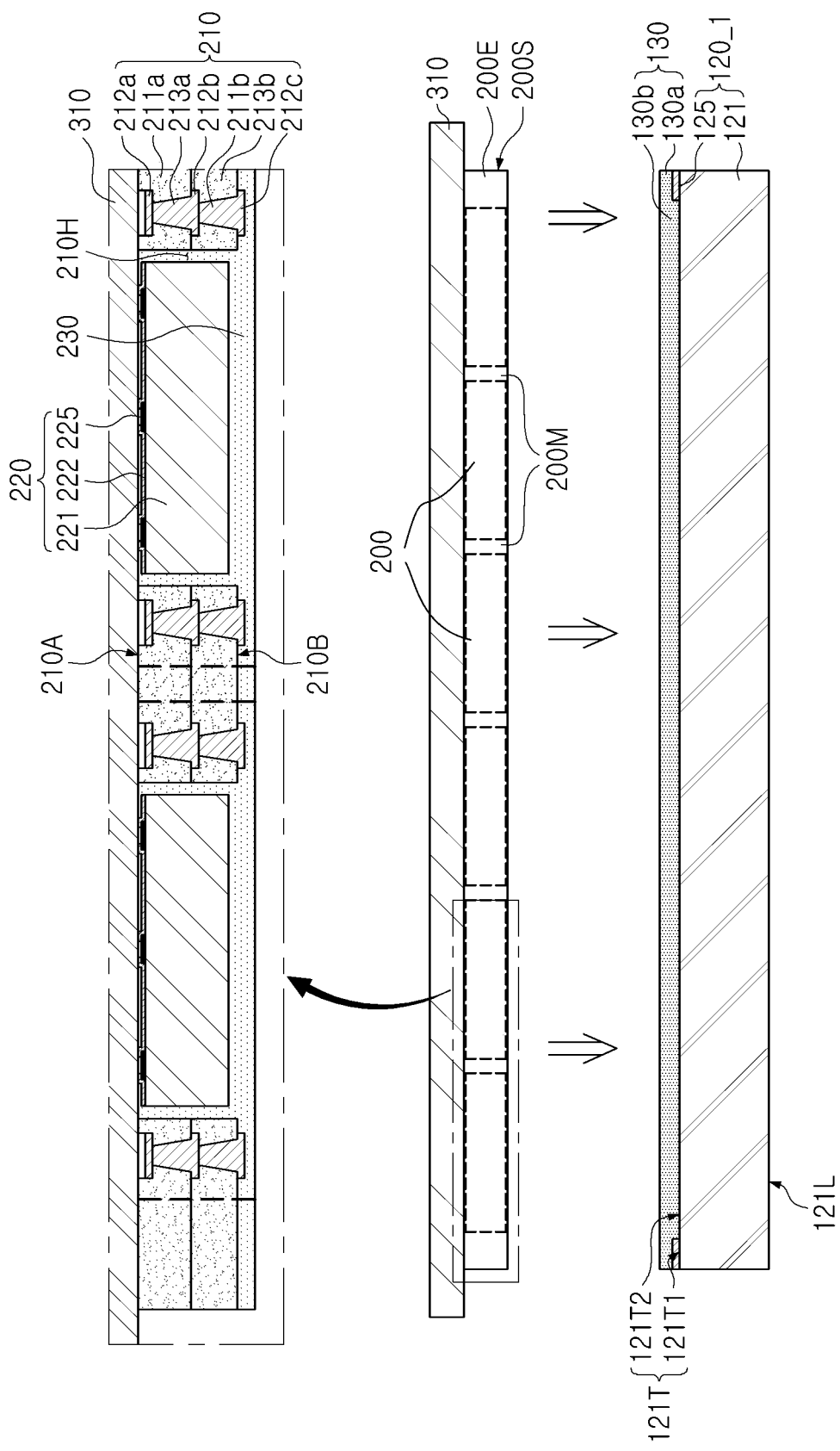
FIGS. 3A and 3B are cross-sectional views illustrating a portion (a bonding process of an object to be processed) of a method of manufacturing a semiconductor package according to an embodiment of the present disclosure.
Figure 3B:
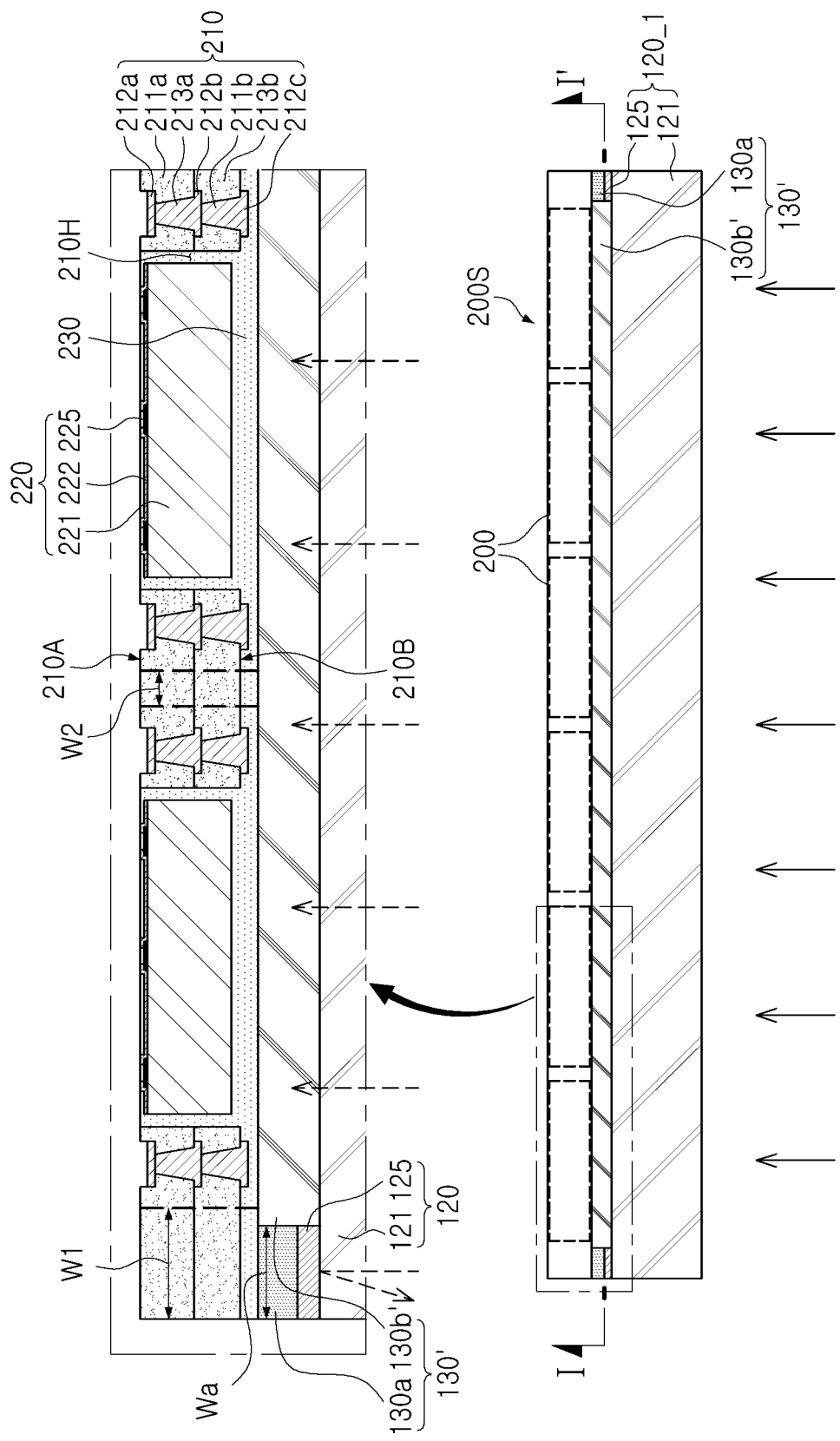

FIGS. 3A and 3B are cross-sectional views illustrating a portion (a bonding process of an object to be processed) of a method of manufacturing a semiconductor package according to an embodiment of the present disclosure, and FIGS. 5A to 5E are cross-sectional views illustrating another portion of a method of manufacturing a semiconductor package according to an embodiment of the present disclosure. In this case, a manufacturing method according to the present embodiment illustrates a manufacturing method of a so-called "panel level package." Descriptions of components of the present embodiment may refer to the description of the same or similar components of the carrier structure 120 illustrated in FIGS. 1 and 2, unless otherwise specifically stated.

Referring to FIG. 3A, a product substrate 200S may be bonded to a first carrier structure 120_1 to which a photosensitive adhesive layer 130 is applied.

The product substrate 200S employed in the present embodiment may include a "panel" for manufacturing a plurality of semiconductor packages. Such a panel may be provided on a first adhesive tape 310. The product substrate 200S illustrated in FIG. 3A may be manufactured through the following processes.

First, a frame 210 having a plurality of cavities 210H may be disposed on the first adhesive tape 310. The frame 210 employed in the present embodiment may include insulating members 211a and 211b having a first surface 210A and a second surface 210B, located opposite to each other, and may have a wiring structure connecting the first surface 210A and the second surface 210B. The insulating members may include first and second insulating layers 211a and 211b, and the wiring structure may include three-layered wiring patterns 212a, 212b, and 212c, and wiring vias 213a and 213b connecting them. For example, the first adhesive tape 310 may be a tape having adhesion, including an epoxy resin. The first adhesive tape 310 may be attached to a lower surface of the first insulating layer 211a.

Next, a semiconductor chip 220 may be in each of the cavities 210H. The semiconductor chip 220 may include a semiconductor body 221 having an active surface such as silicon (Si), germanium (Ge), or gallium arsenide (GaAs), a contact pad 225 formed on the active surface, and a passivation layer 222 on the active surface and exposing the contact pad 225.

Next, an encapsulant 230 for encapsulating the semiconductor chip 220 may be formed. The encapsulant 230 may extend to an upper surface of the frame 210. In the present embodiment, although the encapsulant 230 is illustrated to have an upper surface, substantially flat with a third wiring pattern 212c, the encapsulant 230 may be formed to at least partially cover a portion of the third wiring pattern 212c.

The product substrate 200S may have a dummy region 200E surrounding a plurality of semiconductor package regions 200. As described above, the dummy region 200E may be provided as a region for handling the product substrate 200S in a subsequent processing operation. In addition, the product substrate 200S may have a margin region 200M located between the plurality of semiconductor package regions 200. This margin region 200M may be provided as a scribe lane for cutting into separate individual packages.

As described in FIGS. 1 and 2, a light blocking film 125 may be formed on an edge region 121T1 of an upper surface 121T of a light-transmitting carrier substrate 121, and a photosensitive adhesive layer 130 may be formed on the upper surface 121T of the light-transmitting carrier substrate 121 to cover the light blocking film 125.

The product substrate 200S may be bonded to the photosensitive adhesive layer 130. The photosensitive adhesive layer 130 may have adhesive force for supporting the product substrate 200S during a subsequent process. The photosensitive adhesive layer 130 may be formed using various processes such as a spin coating process, a roll coating process, or the like. For example, the photosensitive adhesive layer 130 may include photosensitive polyimide.

Next, referring to FIG. 3B, a photosensitive adhesive layer 130' may be partially cured by irradiating first light having a first wavelength through a lower surface 121L of a light-transmitting carrier substrate 121.

The photosensitive adhesive layer 130' may include a first portion 130a located on a light blocking film 125, and a second portion 130b' located on an upper surface 121T of the light-transmitting carrier substrate 121 surrounded by the light blocking film 125. The light blocking film 125 may be configured to block the first light for curing the photosensitive adhesive layer 130'. The first light may cure the second portion 130b' of the photosensitive adhesive layer 130' through the lower surface 121L of the light-transmitting carrier substrate 121 to lose or weaken adhesive force.

The first portion 130a, a portion of the photosensitive adhesive layer 130' overlapping the light blocking film 125, may not be cured. As used herein, when element A is said to "overlap" or is "overlapping" element B, it may refer to the situation where element A is said to extend over or past, and cover a part of, element B in a given direction. Note that element A may overlap element B in a first direction, but may or may not overlap element B in a second direction. For example, since the first light toward the first portion 130a of the photosensitive adhesive layer 130' may be blocked by the light blocking film 125, adhesive force of the uncured first portion 130a may be maintained. A width Wa of the light blocking film 125 may be equal to or narrower than a width W1 of a dummy region 200E. For example, the width of the light blocking film 125 may be in a range of 5 mm to 30 mm. A width W2 of a margin region 200M may be narrower than the width W1 of the dummy region 200E.

Figure 4:
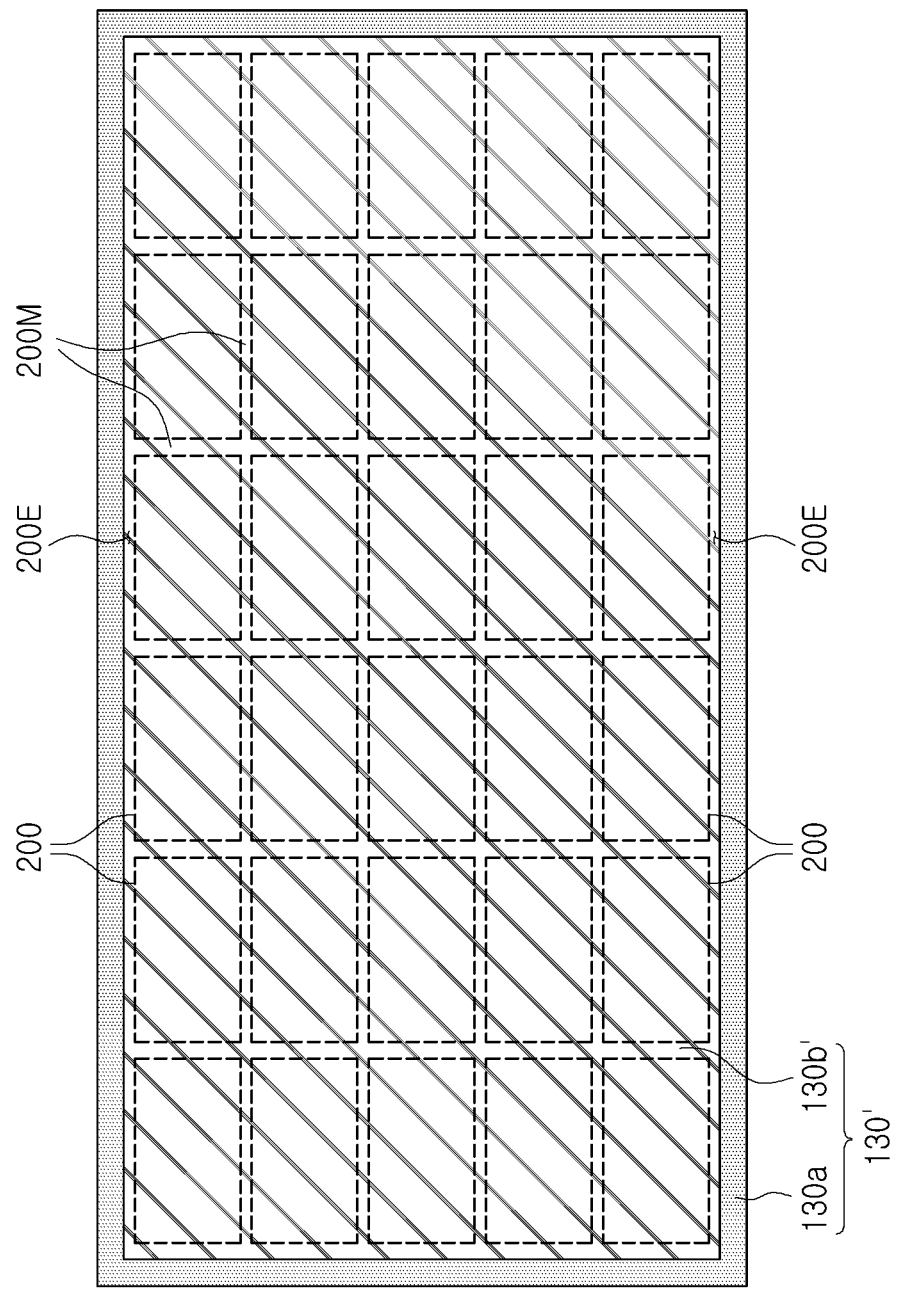
FIG. 4 is a plan view illustrating FIG. 3B, taken along line I-I'.

FIG. 4 is a plan view illustrating FIG. 3B, taken along line I-I'. Descriptions of components of the present embodiment may refer to the description of the same or similar components of the carrier structure 120 illustrated in previous Figures, unless otherwise specifically stated.

Referring to FIG. 4, the first portion 130a overlapping the light blocking film 125 may maintain adhesive force in an uncured state, and the second portion 130b' that does not overlap the light blocking film 125 may be cured to lose or weaken adhesive force. Although the first portion 130a has a relatively small area, the first portion 130a may surround an edge region. Therefore, the product substrate 200S may be stably maintained on a first carrier structure 120_1 in a subsequent processing operation.

Next, after the partial curing is performed, a processing operation of the product substrate 200S for forming the plurality of semiconductor package regions 200 may be performed (please refer to FIGS. 5A to 5D). Descriptions of components of the present embodiment may refer to the description of the same or similar components of the carrier structure 120 illustrated in previous Figures, unless otherwise specifically stated.

Figure 5A:
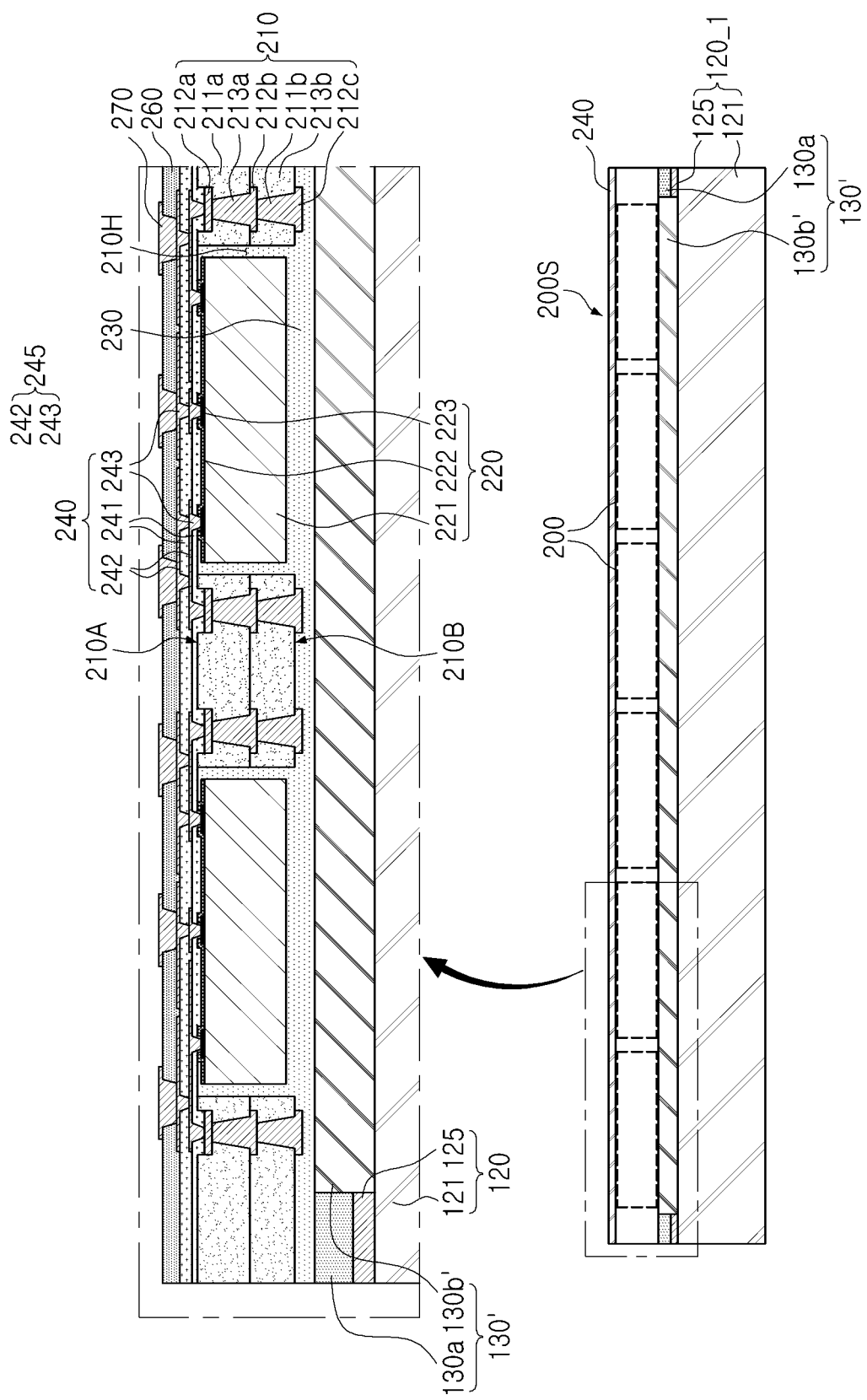
FIGS. 5A to 5E are cross-sectional views illustrating another portion of a method of manufacturing a semiconductor package according to an embodiment of the present disclosure.

First, referring to FIG. 5A, after a first adhesive tape 310 is removed from a product substrate 200S, a first redistribution structure 240 may be formed on the removed surface of the product substrate 200S.

The formation of the first redistribution structure 240 may be performed by forming a first insulating film 241 using a lamination process or a coating process, forming a via hole in the first insulating film 241, and forming a first redistribution layer 245, e.g., a first redistribution pattern 242 and a first redistribution via 243, using an electroplating process or an electroless plating process. When a photo-imageable dielectric (PID) material is used as the first insulating film 241, via-holes may be formed as a fine pitch using a photolithography process. The first redistribution structure 240 may include a plurality of first insulating films 241 and a plurality of first redistribution layers 245 respectively formed on the plurality of first insulating films 241.

Additionally, a passivation layer 260 and an underbump metal layer (UBM layer) 270 may be formed. The passivation layer 260 may be formed on a lower surface of the first redistribution structure 240, a plurality of openings exposing a portion of the first redistribution layer 245 may be formed in the passivation layer 260, and the underbump metal layer 270 may be formed on the passivation layer 260 to be connected to a region of the first redistribution layer 245 through the plurality of openings.

Figure 5B:
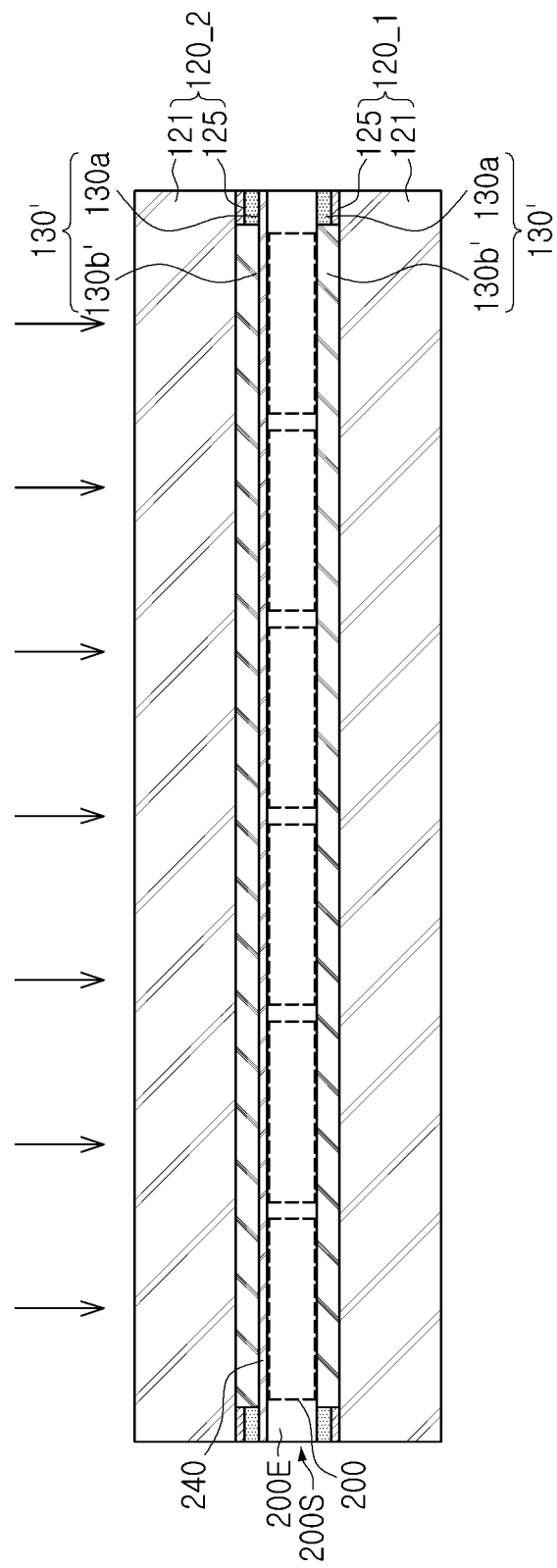

Next, referring to FIG. 5B, a second carrier structure 120_2 may be bonded to the product substrate 200S.

This process may be introduced when a second redistribution structure (see, e.g., 250 of FIG. 5D), which may be a backside redistribution layer, is additionally formed. Similar to the first carrier structure 120_1 of FIG. 3A described above, a light blocking film 125 may be formed on an edge region 121T1 of an upper surface 121T of a light-transmitting carrier substrate 121, and a photosensitive adhesive layer 130' may be formed on the upper surface 121T of the light-transmitting carrier substrate 121 to cover the light blocking film 125. Next, the second carrier structure 120_2 may be bonded to an upper surface of the product substrate 200S, and a surface on which the first redistribution structure 240 is formed on the photosensitive adhesive layer 130'. Next, a second portion 130b' of the photosensitive adhesive layer 130' may be at least partially cured by irradiating the first light through the light-transmitting carrier substrate 121, and the second carrier structure 120_2 and the product substrate 200S may be bonded by a first portion 130a overlapping the light blocking film 125.

Figure 5C:
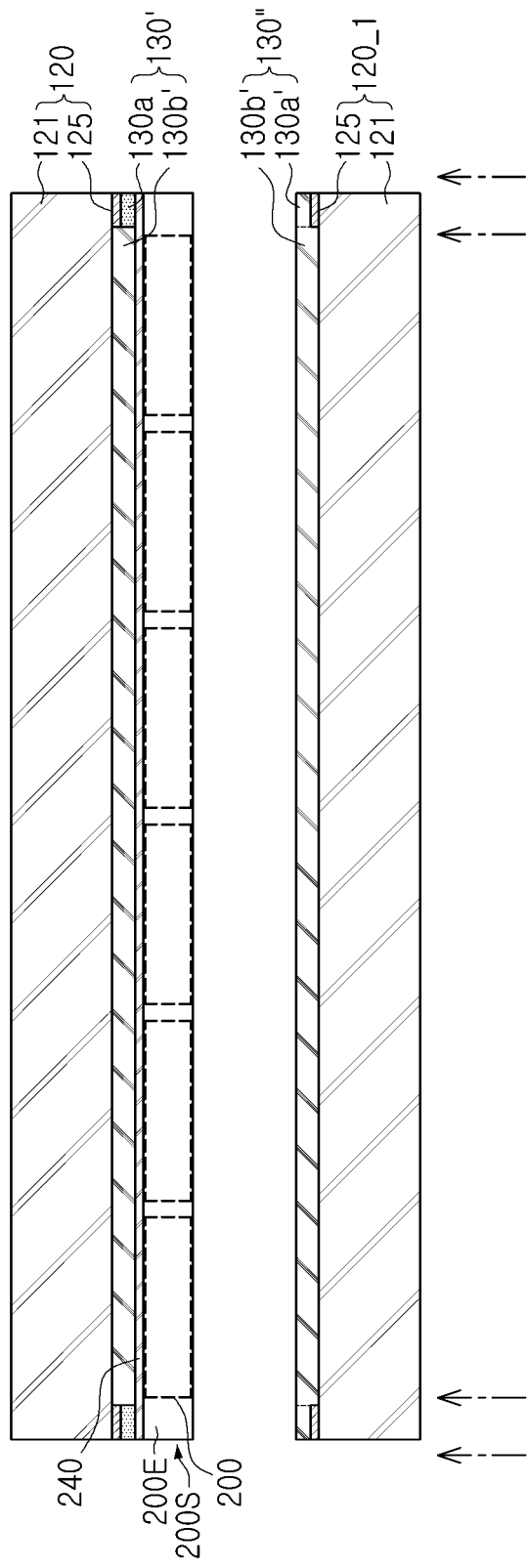

Next, referring to FIG. 5C, the product substrate 200S bonded to the second carrier structure 120_2 may be detached from the first carrier structure 120_1.

The detachment of the first carrier structure 120_1 may be performed by irradiating second light having a second wavelength that is different from the first wavelength through the light blocking film 125 to at least partially cure a portion of the photosensitive adhesive layer 130" overlapping the light blocking film 125, for example, the first portion 130a'.

The photosensitive adhesive layer 130 may be a bonding layer that may be curable in the ultraviolet band.

In some embodiments, the first light may be light of the UV-A band, and the second light may be light of the UV-B band. For example, the light blocking film 125 may include butylmethoxydibenzoylmethane, dibenzoylmethane, oxybenzene, benzophenone-3, benzophenone-8, mexoryl SX, phenylbenzimidazole sulfonic acid, or avobenzone. In another embodiment, the first light may be light of the UV-B band, and the second light may be light of the UV-A band. For example, the light blocking film 125 may include octocrylene, para-aminobenzoic acid, octylmethoxycinnamate, octylsalicylate, or ethylhexyltriazone.

Figure 5D:
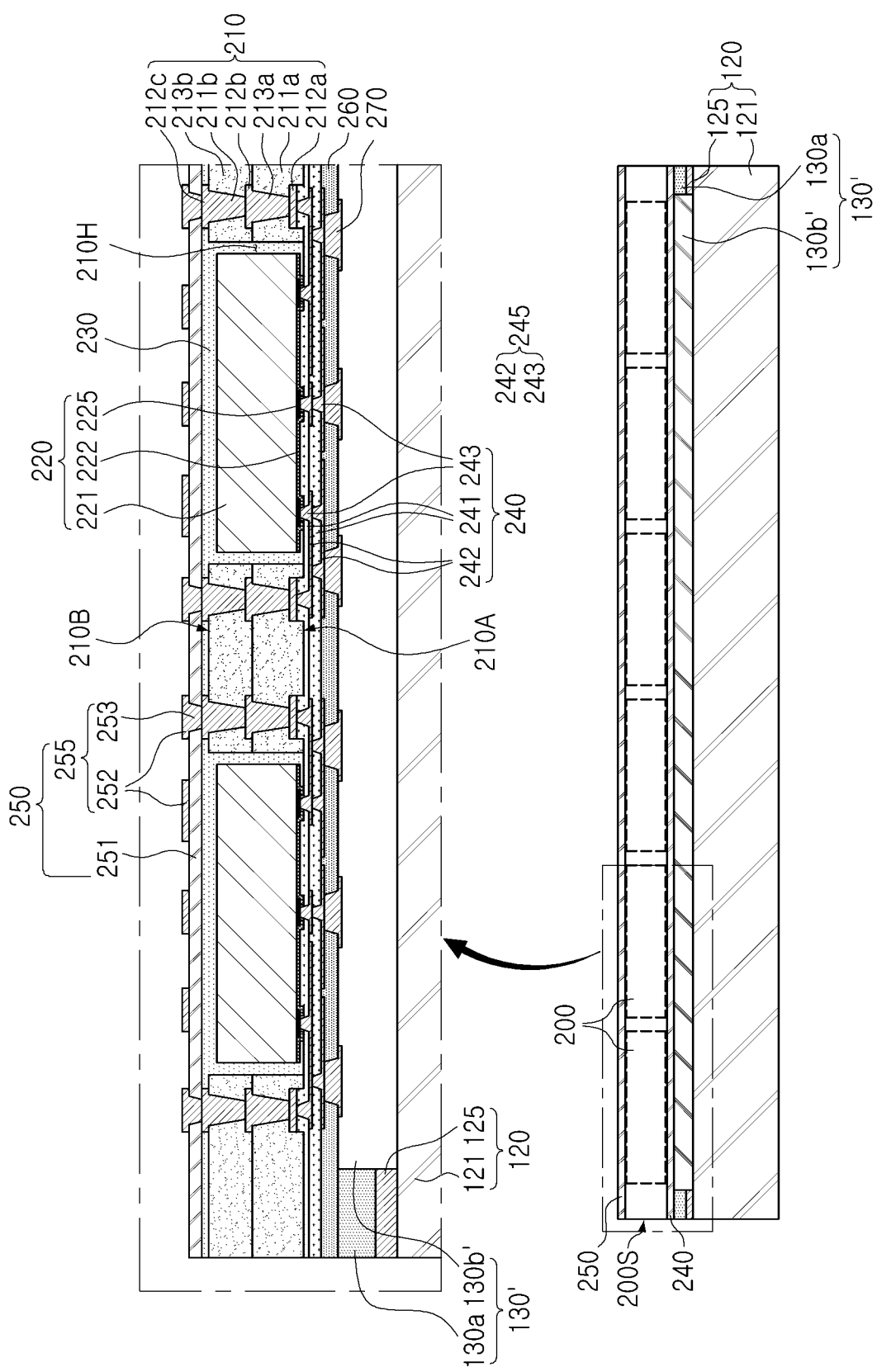

Next, referring to FIG. 5D, a second redistribution structure 250 may be formed on a surface from which the first carrier structure 120_1 is removed.

Formation of the second redistribution structure 250 may include forming a second insulating film 251, forming a via hole in the second insulating film 251, and forming a second redistribution layer 255, e.g., a second redistribution pattern 252 and a second redistribution via 253. The second insulating film 251 may include a PID material.

As described above, a portion (e.g., 130b') of the photosensitive adhesive layer 130 to be cured which contacts a plurality of semiconductor package regions 200 of the product substrate 200S may have weak or virtually absent adhesive force. Therefore, even though mechanical impact is generated in the formation of the second redistribution structure 250, damage to the first redistribution structure 240 (in particular, the UBM layer 270) previously formed in each of the plurality of semiconductor package regions 200 may be prevented.

Figure 5E:
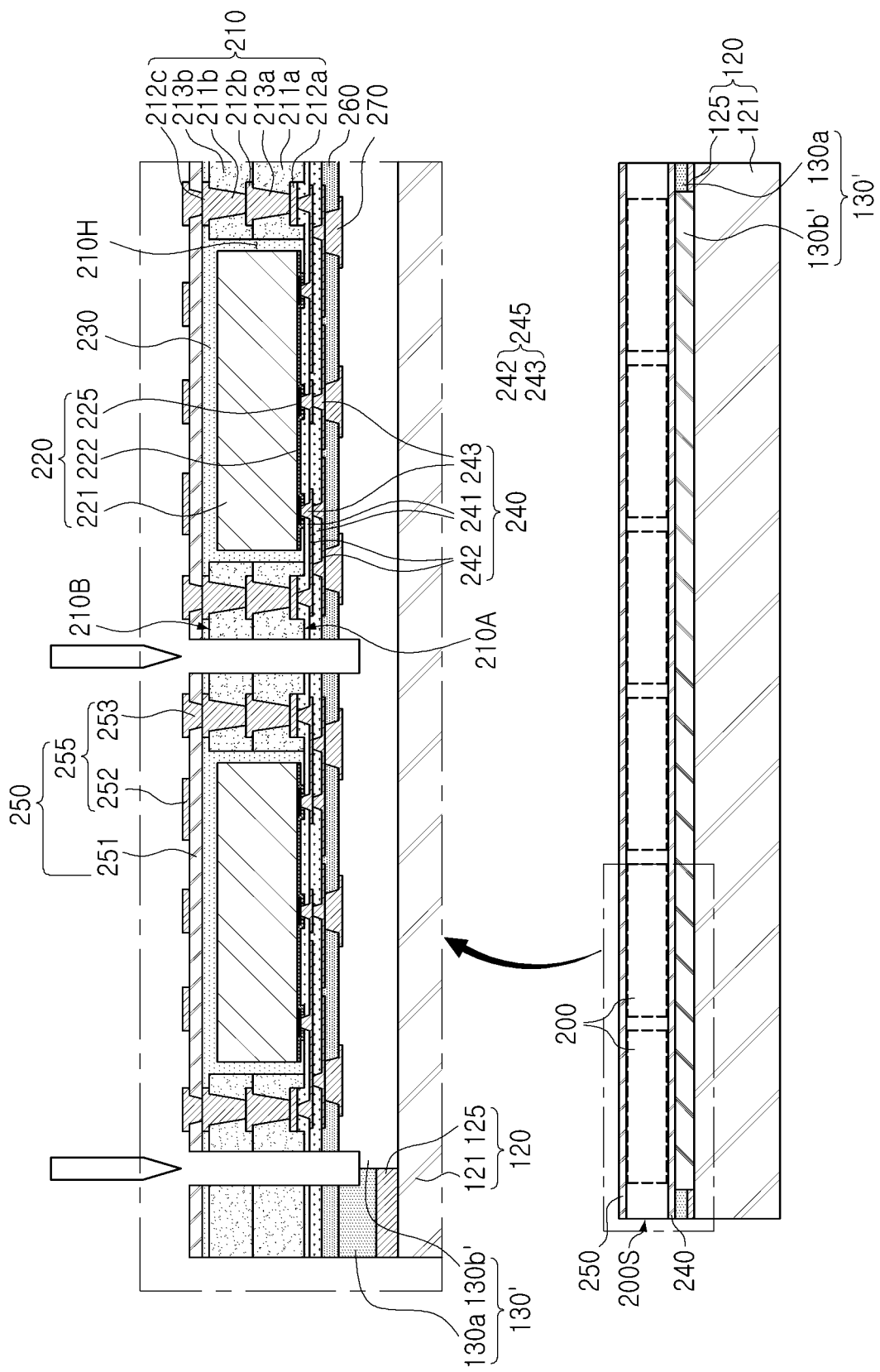

Next, referring to FIG. 5E, the product substrate 200S illustrated in FIG. 5D may be cut into a plurality of separate individual semiconductor devices 200.

In this cutting process, a portion (e.g., 130a) of the photosensitive adhesive layer 130 overlapping the light blocking film 125 may be partially removed. Since the previously cured second portion 130b' has previously lost adhesive force, an individualized semiconductor package 200 may be detached from the first portion 130a still having adhesive force by the partial removal of this process.

Figure 6A:
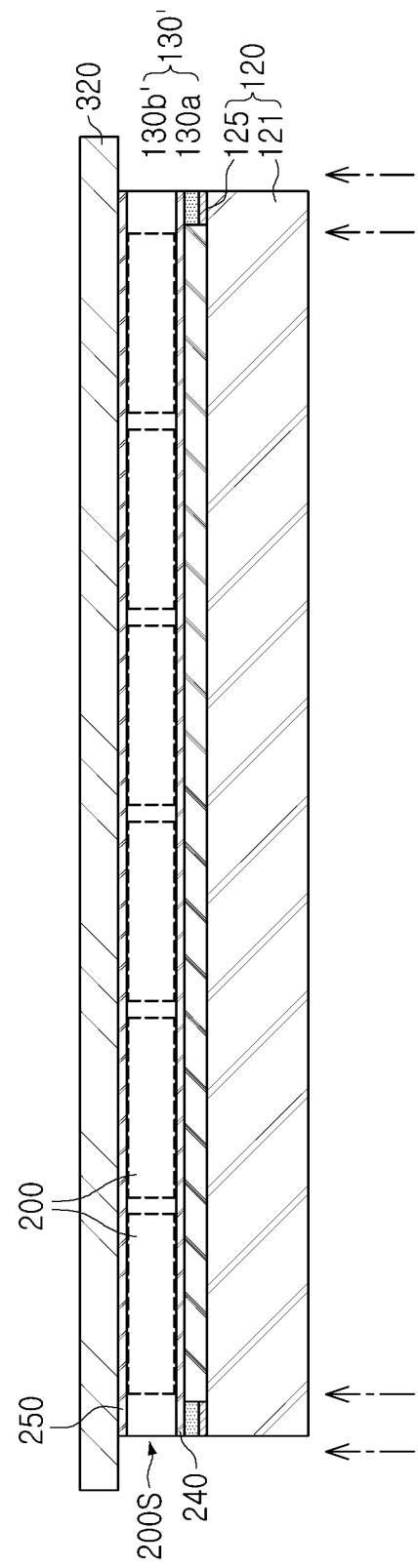
FIGS. 6A and 6B are cross-sectional views illustrating a cutting process in a method of manufacturing a semiconductor package according to an embodiment of the present disclosure.
Figure 6B:
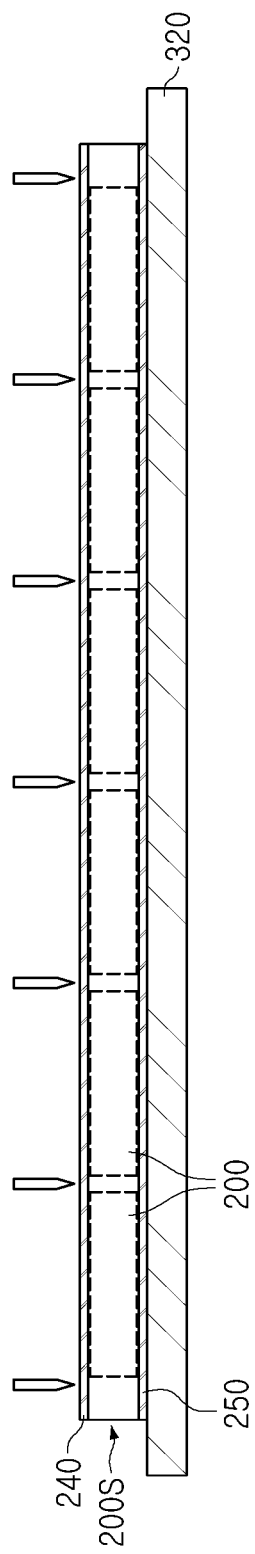

A process of additionally separating using irradiation of another ultraviolet light may be performed similarly to the process of FIG. 5C, without detaching from the second carrier structure by the cutting process. FIGS. 6A and 6B are cross-sectional views illustrating a cutting process in a method of manufacturing a semiconductor package according to an embodiment of the present disclosure. Descriptions of components of the present embodiment may refer to the description of the same or similar components of the carrier structure 120 illustrated in previous figures, unless otherwise specifically stated.

Referring to FIG. 6A, a second adhesive tape 320 may be attached to an upper surface of a product substrate 200S on which a plurality of semiconductor packages 200 are formed, and a first portion 130a' of a photosensitive adhesive layer 130' may be at least partially cured by irradiating second light within a second wavelength that is different from the first wavelength through a light blocking film 125. Since adhesive force of a previously cured second portion 130b' is lost, the photosensitive adhesive layer 130' and the product substrate 200S may be detached by additional curing of the first portion 130a'.

Next, referring to FIG. 6B, after detaching the product substrate 200S from a light-transmitting carrier substrate 121, the product substrate 200S may be cut into the plurality of semiconductor packages 200.

As described above, a portion (e.g., 130b') of the photosensitive adhesive layer 130' to be cured which contacts the plurality of semiconductor packages 200 of the product substrate 200S may have weak or virtually absent adhesive force. Therefore, damage or contamination of the first redistribution structure 240 (in particular, the UBM layer 270) previously formed in each of the semiconductor package regions 200 may be effectively prevented.

FIGS. 7A to 7D are plan views illustrating a carrier structure according to various embodiments of the present disclosure.

Referring to FIG. 7A, it can be understood that a carrier structure 120A according to the present embodiment is similar to that illustrated in FIGS. 1 and 2, except that a light blocking film 125 has an inner pattern 125b extending to an inner region 121T2 in addition to an edge pattern 125a, as illustrated in FIGS. 1 and 2. Descriptions of components of the present embodiment may refer to the description of the same or similar components of the carrier structure 120 illustrated in FIGS. 1 and 2, unless otherwise specifically stated.

The light blocking film 125 employed in the present embodiment may be formed on an upper surface 121T of a light-transmitting carrier substrate 121 having a rectangular structure similar to that of the previous embodiments, and may include an edge pattern 125a formed along an edge region 121T1 of the upper surface 121T, and an inner pattern 125b extending to the inner region 121T2 surrounded by the edge region. The inner pattern 125b may be configured to connect two opposite sides to intersect the inner region 121T2 of the upper surface.

The light blocking film 125 may have a width equal to or narrower than the width W1 of the dummy region (200E of FIG. 3B). For example, the width of the light blocking film 125 may be in a range of 5 mm to 30 mm. In some embodiments, the width of the light blocking film 125 may range of 10 mm to 25 mm. The inner pattern 125b may have a width different from a width of the edge pattern 125a.

Referring to FIG. 7B, it can be understood that a carrier structure 120B according to the present embodiment is similar to that illustrated in FIGS. 1 and 2, except that a light blocking film 125 has first and second inner patterns 125b1 and 125b2 extending and intersecting in different directions (e.g., in a vertical direction) in an inner region, other than an edge pattern 125a. Descriptions of components of the present embodiment may refer to the description of the same or similar components of the carrier structure 120 illustrated in FIGS. 1 and 2, unless otherwise specifically stated.

The light blocking film 125 employed in the present embodiment may include an edge pattern 125a formed along an edge region of an upper surface 121T, a first inner pattern 125b1 extending in a first direction, and a second inner pattern 125b2 extending in a second direction perpendicular to the first direction. Each of the first and second inner patterns 125b1 and 125b2 may have a width Wb that is narrower than a width Wa of the edge pattern 125a. As illustrated in FIG. 3B, a product substrate 200S to be bonded may include a dummy region 200E surrounding a plurality of semiconductor package regions 200, and a margin region 200M located between the plurality of semiconductor packages 200.

The edge pattern 125a may have a width equal to or narrower than the width W1 of the dummy region 200E. For example, the width of the edge pattern 125a may be in a range of 5 mm to 30 mm. In some embodiments, the width of the edge pattern 125a may range of 10 mm to 25 mm. The inner pattern 125b may have a width Wb that is narrower than a width Wa of the edge pattern 125a. Each of the first and second inner patterns 125b1 and 125b2 may have a width that is equal to or narrower than a width of the margin region 200M. Also, the first and second inner patterns 125b1 and 125b2 may be arranged to overlap the margin region 200M, respectively.

Referring to FIG. 7C, it can be understood that a carrier structure 120C according to the present embodiment is similar to that illustrated in FIGS. 1 and 2, except that a light blocking film 125 has first and second inner patterns 125b1 and 125b2 extending and intersecting in different directions (e.g., in a vertical direction) in an inner region, other than an edge pattern 125a, and the second inner patterns 125b2 may be arranged as a plurality of second inner patterns 125b2. Descriptions of components of the present embodiment may refer to the description of the same or similar components of the carrier structure 120 illustrated in FIGS. 1 and 2, unless otherwise specifically stated.

The light blocking film 125 employed in the present embodiment, similarly to the embodiment illustrated in FIG. 7B, may include an edge pattern 125a formed along an edge region of an upper surface 121T, a first inner pattern 125b1 extending in a first direction, and a second inner pattern 125b2 extending in a second direction that is perpendicular to the first direction. The second inner patterns 125b2 may be arranged as a plurality of second inner patterns 125b2. The first inner pattern 125b1 as well as the plurality of second inner patterns 125b2 may be arranged to respectively overlap a margin region 200M. The first and second inner patterns 125b1 and 125b2 may have a width that is equal to or narrower than a width of the margin region 200M. In addition, each of the first and second inner patterns 125b1 and 125b2 may have a width that is narrower than a width Wa of the edge pattern 125a, and may have different widths Wb1 and Wb2, as in the present embodiment.

In the present embodiment, although an example in which the second inner pattern 125b2 is provided in plural is illustrated, the first inner pattern 125b1 may be provided in plural and the two inner patterns 125b1 and 125b2 may be provided in plural.

Referring to FIG. 7D, it can be understood that a carrier structure 120D according to the present embodiment is similar to that illustrated in FIGS. 1 and 2, except that a light blocking film 125' has a discontinuous pattern. Descriptions of components of the present embodiment may refer to the description of the same or similar components of the carrier structure 120 illustrated in FIGS. 1 and 2, unless otherwise specifically stated.

Unlike the embodiments of FIGS. 1 and 2, the light blocking film 125' employed in the present embodiment may. Such a discontinuous pattern may be similarly applied to the inner patterns 125b, 125b1, and 125b2 employed in the previous embodiments.

The carrier structure 120 according to the previous embodiments is illustrated to form a rectangular shape corresponding to a shape of the product substrate 200S as a rectangular panel, but the present disclosure is not limited thereto, and may have a corresponding circular shape for supporting the product substrate, which may be a wafer.

Figure 8:
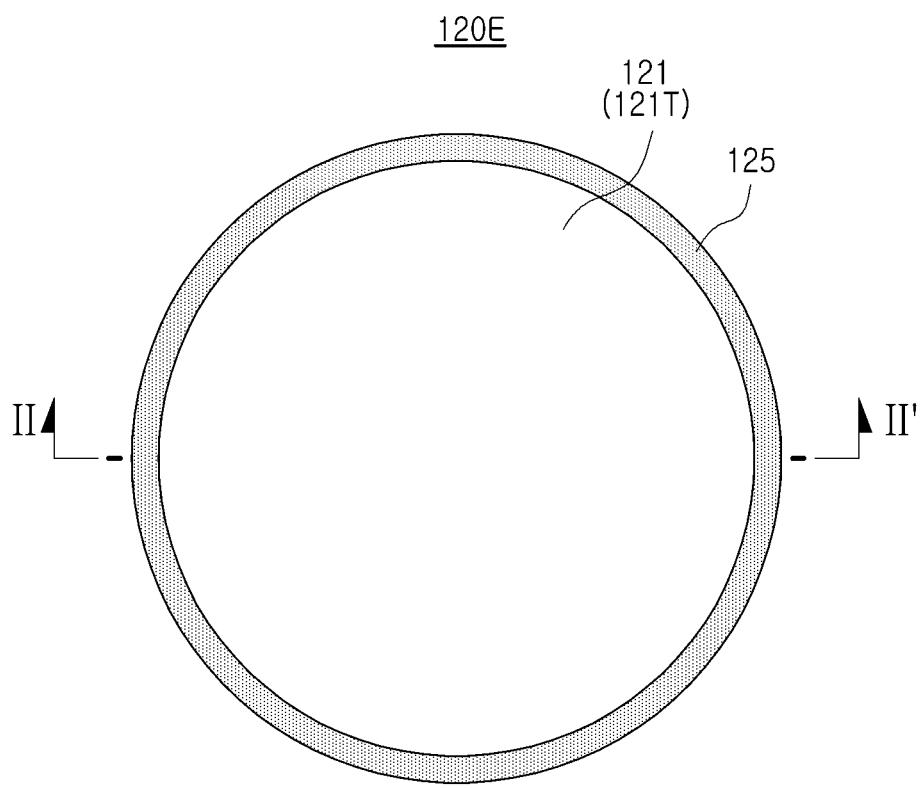
FIG. 8 is a plan view illustrating a carrier structure according to an embodiment of the present disclosure.

FIG. 8 is a plan view illustrating a carrier structure according to an embodiment of the present disclosure.

Referring to FIG. 8, it can be understood that a carrier structure 120E according to the present embodiment is similar to that illustrated in FIGS. 1 and 2, except that a light-transmitting carrier substrate 121 on which a light blocking film 125 is formed has a circular upper surface 121T. Descriptions of components of the present embodiment may refer to the description of the same or similar components of the carrier structure 120 illustrated in FIGS. 1 and 2, unless otherwise specifically stated.

The light-transmitting carrier substrate 121 employed in the present embodiment may have a circular planar shape corresponding to a wafer, which may be a product substrate. A product substrate on which the carrier structure 120E according to the present embodiment is used may be a wafer on which a plurality of semiconductor devices for a so-called "wafer level package" are implemented. The light blocking film 125 may be continuously formed along an edge region of the upper surface 121T of the light-transmitting carrier substrate 121 having a circular shape. The light blocking film 125 is not limited to a continuous edge pattern, and may have other patterns similar to the various patterns illustrated in the previous embodiments (FIGS. 7A to 7B).

FIGS. 9A to 9D are cross-sectional views illustrating a method of manufacturing a semiconductor package according to an embodiment of the present disclosure. Descriptions of components of the present embodiment may refer to the description of the same or similar components of the carrier structure 120 illustrated in previous Figures, unless otherwise specifically stated.

Figure 9A:
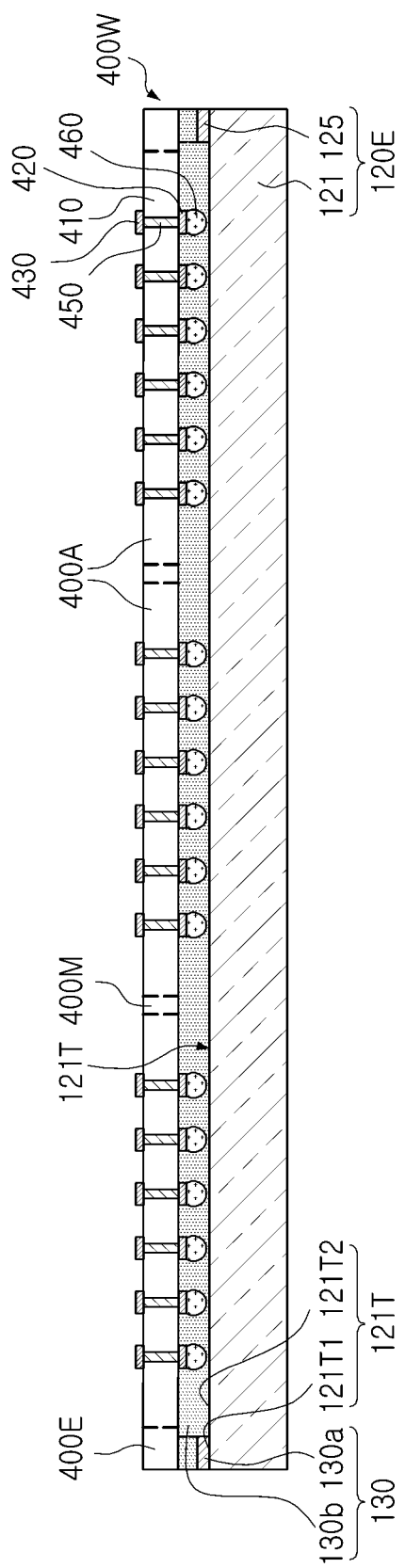
FIGS. 9A to 9D are cross-sectional views illustrating a method of manufacturing a semiconductor package according to an embodiment of the present disclosure.

Referring to FIG. 9A, a semiconductor wafer 400W may be bonded to a carrier structure 120E to which a photosensitive adhesive layer 130 is applied.

The semiconductor wafer 400W employed in the present embodiment may be a "semiconductor wafer" on which a plurality of first semiconductor chips 400A may be implemented. In the present embodiment, each of the plurality of first semiconductor chips 400A may have a structure provided as a base substrate of a semiconductor package. Each of the plurality of first semiconductor chips 400A may include a semiconductor substrate 410 having an active surface and a non-active surface located opposite thereto, a first pad 420 on the active surface of the semiconductor substrate 410, a second pad 430 on the non-active surface of the substrate 410, and a through-electrode 450 passing through the semiconductor substrate 410 and connecting the first and second pads 420 and 430. A connection bump 460 such as a solder ball may be formed on the first pad 420 of the first semiconductor chip 400A. In the present embodiment, although the first semiconductor chips 400A is illustrated to be introduced as the base substrates, the first semiconductor chips 400A may be implemented as an interposer having a wiring structure.

As illustrated in FIG. 9A, the semiconductor wafer 400W on which the connection bump 460 is formed may be attached to the photosensitive adhesive layer 130 on the carrier structure 120E. The semiconductor wafer 400W may be attached to the photosensitive adhesive layer 130 such that the connection bump 460 faces the carrier structure 120E. The connection bump 460 may be covered by the photosensitive adhesive layer 130. Among lower surfaces of the semiconductor wafer 400W, a lower surface on which the connection bump 460 is not formed may be bonded to the photosensitive adhesive layer 130.

As described in the previous embodiment (FIG. 3A), a light blocking film 125 may be formed on an edge region 121T1 of an upper surface 121T of a light-transmitting carrier substrate 121, and a photosensitive adhesive layer 130 may be formed on the upper surface 121T of the light-transmitting carrier substrate 121 to at least partially cover the light blocking film 125. The semiconductor wafer 400W may be bonded to the photosensitive adhesive layer 130.

Figure 9B:
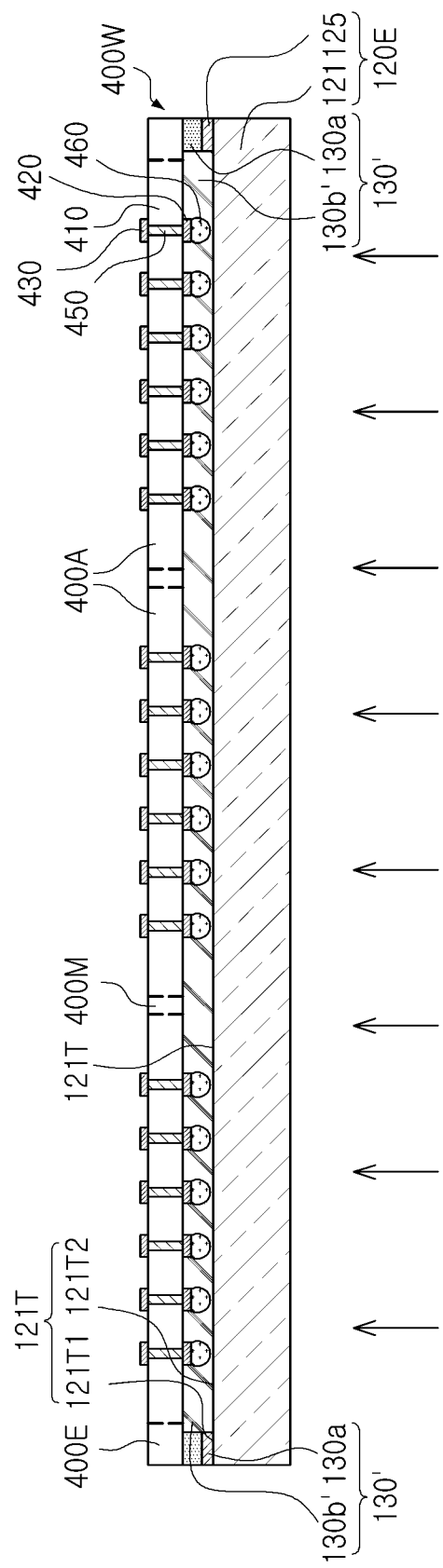

Next, referring to FIG. 9B, the photosensitive adhesive layer 130 may be partially cured by irradiating light within a first wavelength band through a lower surface of the light-transmitting carrier substrate 121.

The photosensitive adhesive layer 130 may include a first portion 130a located on the light blocking film 125, and a second portion 130b located on a region of the upper surface of the light-transmitting carrier substrate 121 surrounded by the light blocking film 125. The light blocking film 125 may be configured to block the first light for curing the photosensitive adhesive layer 130. The first light may at least partially cure the second portion 130b' of the photosensitive adhesive layer 130 through the lower surface of the light-transmitting carrier substrate 121 to lose or weaken adhesive force.

The first portion 130a, which may be a portion of the photosensitive adhesive layer 130 overlapping the light blocking film 125, may not be cured. For example, since the first light toward the first portion 130a of the photosensitive adhesive layer 130 may be blocked by the light blocking film 125, adhesive force of the uncured first portion 130a may be maintained. A width of the light blocking film 125 may be equal to or narrower than a width of a dummy region 400E. The semiconductor wafer 400W may have a margin region 400M located between the plurality of first semiconductor chips 400A. In the cutting process for singulation, the margin region 400M may be removed. A width of a margin region 200M may be narrower than a width of the dummy region 400E.

Figure 9C:
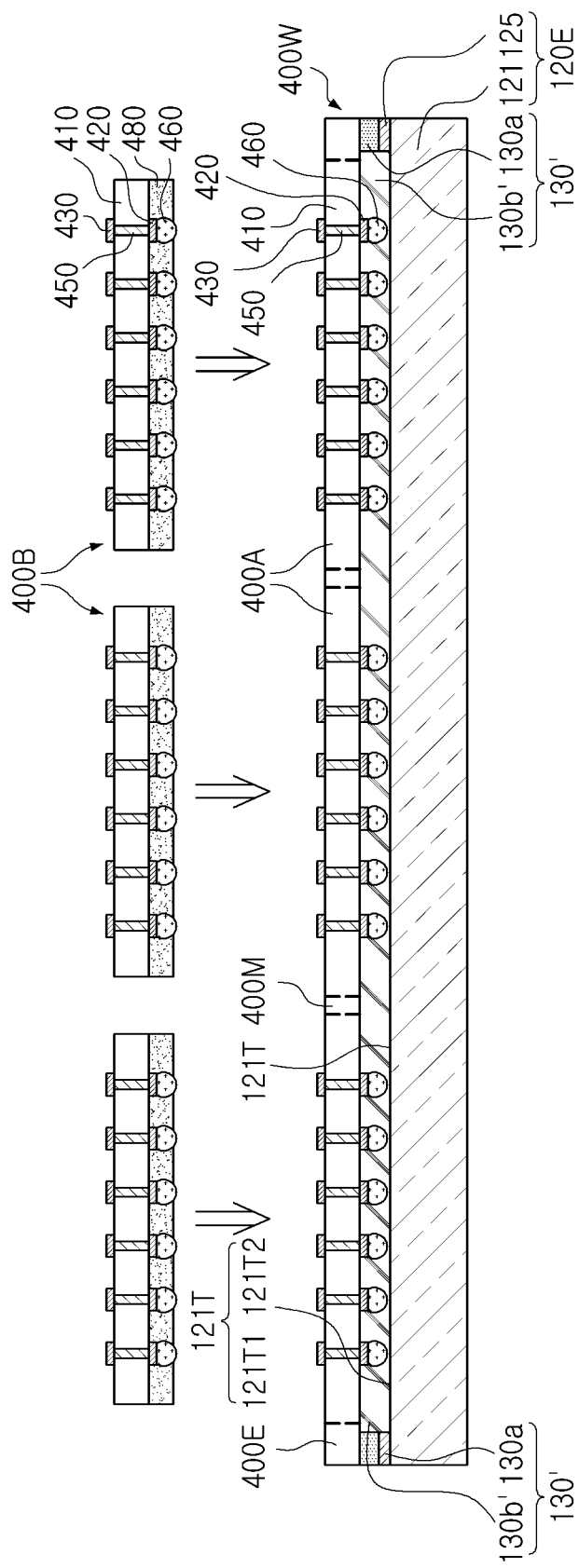

Referring to FIG. 9C, one or more second semiconductor chips 400B may be stacked on the semiconductor wafer 400W.

The second semiconductor chips 400B may be obtained by cutting a second semiconductor wafer on which a plurality of semiconductor chips are manufactured similarly to the first semiconductor wafer 400W. In the present embodiment, the second semiconductor wafer may be a semiconductor wafer including individual devices of the same type as that of the first semiconductor wafer 400W. For example, the plurality of second semiconductor chips 400B may include a second semiconductor substrate 410, first and second pads 420 and 430, a through-electrode 450, and a connection bump 460. Each of the plurality of second semiconductor chips 400B may be stacked on the first semiconductor chip 400A of the first semiconductor wafer 400W by using a non-conductive film 480. The first pad 420 of each of the plurality of second semiconductor chips 400B may be connected to the second pad 430 of the first semiconductor chips by the connection bump 460.

Figure 9D:
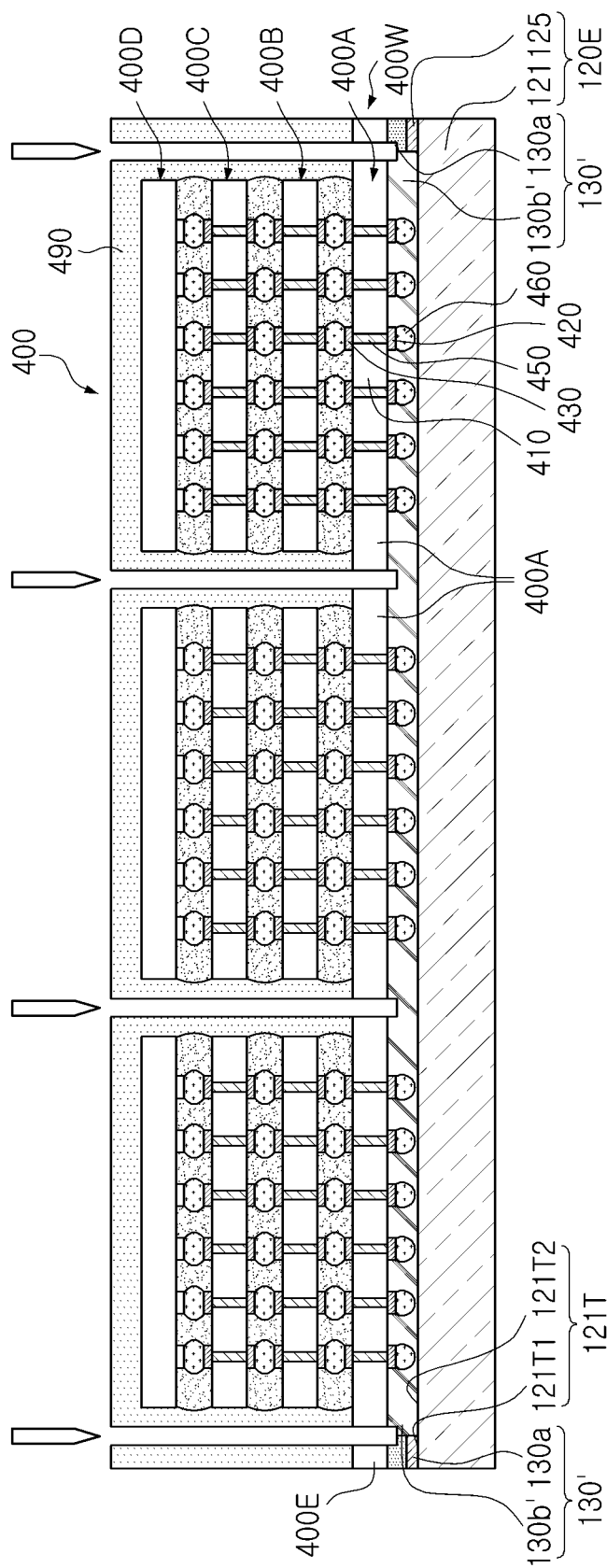

Referring to FIG. 9D, similarly to the previous stacking process on the second semiconductor chips 400B, one or more third semiconductor chips 400C and one or more fourth semiconductor chips 400D may be sequentially stacked, respectively, on the semiconductor wafer 400W. A molding portion 490 may be formed to cover the second to fourth semiconductor chips 400B, 400C, and 400D. A stacking process of the second to fourth semiconductor chips 400B, 400C, and 400D may be performed by a reflow process or a thermal compression process. The molding portion 490 may include, for example, an epoxy mold compound (EMC). In a cutting process for singulation, the semiconductor wafer 400W together with the molding portion 490 may be cut into a semiconductor package 400.

In this cutting process, a portion (e.g., 130*a*) of the photosensitive adhesive layer 130 overlapping the light blocking film 125 may be partially removed. Since the previously cured second portion 130*b*' has previously lost adhesive force, the individualized semiconductor package 200 may be detached from the first portion 130*a* having adhesive force by the partial removal of the present process.

The first to fourth semiconductor chips 400A, 400B, 400C, and 400D employed in the present embodiment may be a memory chip or a logic chip. In some embodiments, the first to fourth semiconductor chips 400A, 400B, 400C, and 400D may all be the same type of memory chip, and in other embodiments, the first to fourth semiconductor chips 400A, 400B, 400C, and 400D may be a memory chip, and some may be a logic chip.

For example, the memory chip may be a volatile memory chip such as a dynamic random access memory (DRAM) or a static random access memory (SRAM), or may be a non-volatile memory chip such as a phase-change random access memory (PRAM), a magnetoresistive random access memory (MRAM), a ferroelectric random access memory (FeRAM) or a resistive random access memory (RRAM). Also, the logic chip may be, for example, a microprocessor, an analog device, or a digital signal processor. In certain embodiments, the first to fourth semiconductor chips 400A, 400B, 400C, and 400D may be a DRAM, and the semiconductor package 200 may be a high bandwidth memory (HBM).

Figure 10A:
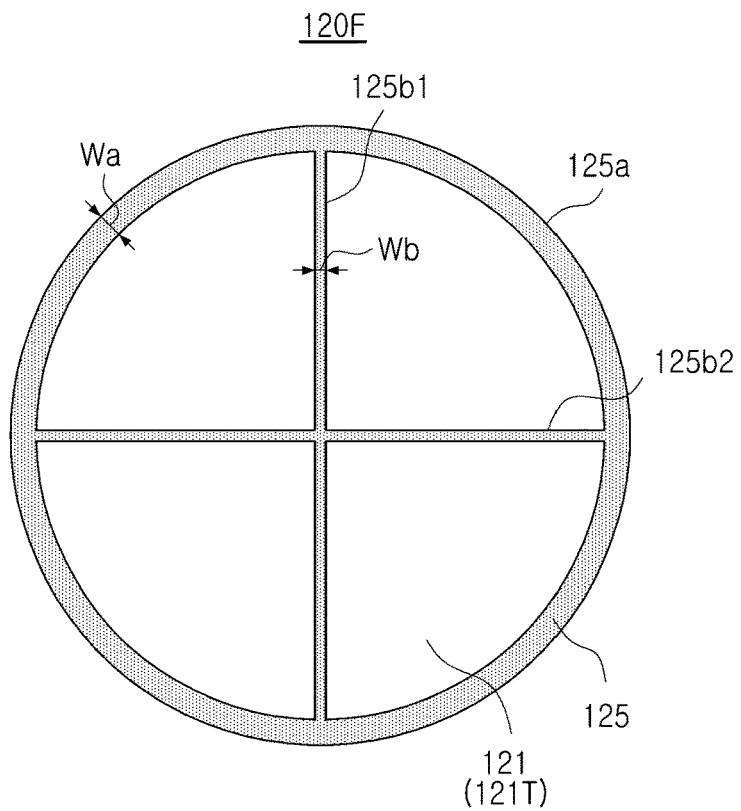
FIGS. 10A and 10B are plan views illustrating a carrier structure according to various embodiments of the present disclosure.
Figure 10B:
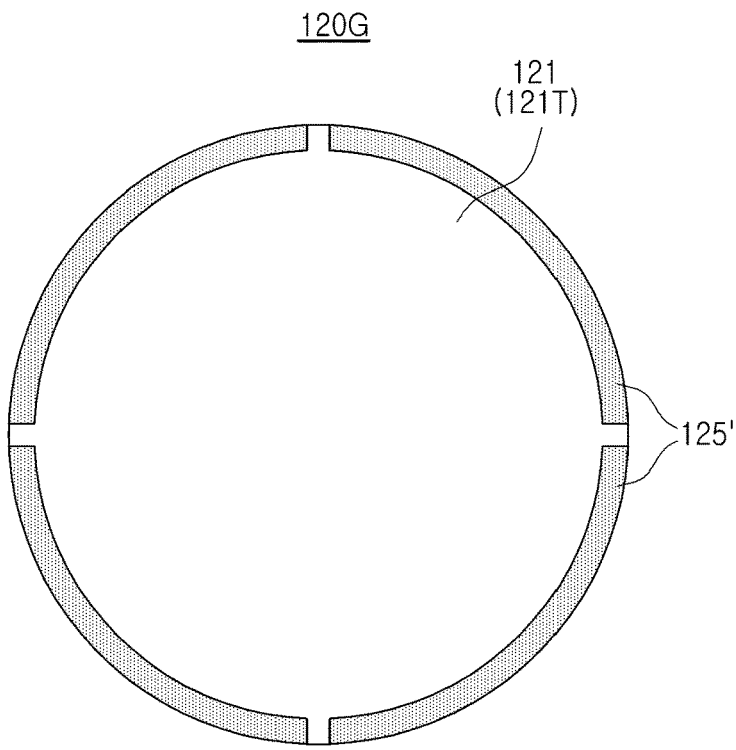

FIGS. 10A and 10B are plan views illustrating a carrier structure according to various embodiments of the present disclosure.

Referring to FIG. 10A, it can be understood that a carrier structure 120F according to the present embodiment is similar to that illustrated in FIG. 8, except that a light blocking film 125 has first and second inner patterns 125*b*1 and 125*b*2 extending and intersecting in different directions (e.g., in a vertical direction) in an inner region, other than an edge pattern 125*a*. Descriptions of components of the present embodiment may refer to the description of the same or similar components of the carrier structure 120E illustrated in FIG. 8, unless otherwise specifically stated.

The light blocking film 125 employed in the present embodiment may include an edge pattern 125*a* formed along an edge region of an upper surface 121T, a first inner pattern 125*b*1 extending in a first direction, and a second inner pattern 125*b*2 extending in a second direction perpendicular to the first direction. Each of the first and second inner patterns 125*b*1 and 125*b*2 may have a width Wb that is narrower than a width Wa of the edge pattern 125*a*. Each of the first and second inner patterns 125*b*1 and 125*b*2 may have a width Wb that is equal to or narrower than a width of a margin region 200M. Also, the first and second inner patterns 125*b*1 and 125*b*2 may be arranged to overlap the margin region 200M, respectively.

Referring to FIG. 10B, it can be understood that a carrier structure 120G according to the present embodiment is similar to that illustrated in FIG. 8, except that a light blocking film 125' has a discontinuous pattern. Descriptions of components of the present embodiment may refer to the description of the same or similar components of the carrier structure 120E illustrated in FIG. 8, unless otherwise specifically stated.

Unlike the embodiment of FIG. 8, the light blocking film 125' employed in the present embodiment may include a plurality of edge patterns discontinuously formed along an edge region. Such a discontinuous pattern may be similarly applied to the inner patterns 125*b*1 and 125*b*2 employed in the previous embodiments.

According to an embodiment of the present disclosure, damage to a product substrate may be minimized and the product substrate may be easily detached from a photosensitive adhesive layer, by partially curing the photosensitive adhesive layer bonded to the product substrate using a light blocking film, in a process of manufacturing a semiconductor device.

Various advantages and effects of the present disclosure are not limited to the above, and will be more easily understood in the process of describing specific embodiments of the present disclosure.

While example embodiments have been illustrated and described above, it will be apparent to those skilled in the art that modifications and variations could be made without departing from the scope of the present disclosure as defined by the appended claims.

What is claimed is:

1. A method of manufacturing a semiconductor device, comprising:
    forming a light blocking film configured to block first light within a first wavelength band on an edge region of an upper surface of a light-transmitting carrier substrate;
    forming a photosensitive adhesive layer on the upper surface of the light-transmitting carrier substrate to at least partially cover the light blocking film;
    bonding a product substrate to the upper surface of the light-transmitting carrier substrate using the photosensitive adhesive layer;
    partially curing the photosensitive adhesive layer by irradiating the first light through the light-transmitting carrier substrate, wherein a portion of the photosensitive adhesive layer overlapping the light blocking film is not cured;
    processing the product substrate to form a plurality of semiconductor devices, after the partially curing of the photosensitive adhesive layer; and
    cutting the product substrate such that the plurality of semiconductor devices are cut into a plurality of separate individual semiconductor devices.

2. The method of claim 1, wherein the light blocking film comprises a pattern continuously formed along the edge region.

3. The method of claim 1, wherein the product substrate has a dummy region surrounding the plurality of semiconductor devices, and
    wherein the light blocking film has a width equal to or narrower than a width of the dummy region.

4. The method of claim 3, wherein the width of the light blocking film is 5 mm to 30 mm.

5. The method of claim 1, further comprising forming the light blocking film to have an edge pattern located in the edge region and an inner pattern extending from the upper surface to an inner region surrounded by the edge region.

6. The method of claim 5, wherein the product substrate has a margin region located between the plurality of semiconductor devices, wherein the inner pattern has a width equal to or narrower than a width of the margin region, and is located to overlap the margin region, and wherein the inner pattern has a width smaller than a width of the edge pattern.

7. The method of claim 1, wherein forming the light blocking film comprises forming the light blocking film to have one or more edge patterns discontinuously formed along the edge region.

8. The method of claim 5, wherein the inner pattern comprises at least one first inner pattern extending in a first direction, and at least one second inner pattern extending in a second direction intersecting the first direction.

9. The method of claim 1, further comprising:
before the cutting of the product substrate, attaching adhesive tape to an upper surface of the product substrate on which the plurality of semiconductor devices are formed;
curing the portion of the photosensitive adhesive layer overlapping the light blocking film by irradiating second light having a second wavelength that is outside the first wavelength band through the light blocking film; and
detaching the product substrate from the light-transmitting carrier substrate.

10. The method of claim 9, wherein the first light is ultraviolet light of a Ultraviolet A (UV-A) band, and the second light is ultraviolet light of a Ultraviolet B (UV-B) band.

11. The method of claim 10, wherein the light blocking film comprises a material selected from the group consisting of butylmethoxydibenzoylmethane, dibenzoylmethane, oxybenzone, benzophenone-3, benzophenone-8, Mexoryl-SX, phenylbenzimidazole sulfonic acid (PSA), and/or Avobenzone.

12. The method of claim 9, wherein the first light is ultraviolet light of a Ultraviolet B (UV-B) band, and the second light is ultraviolet light of a Ultraviolet A (UV-A) band.

13. The method of claim 12, wherein the light blocking film comprises a material selected from the group consisting of octocrylene, para-aminobenzoic acid, octyl methoxycinnamate, octyl salicylate, and/or ethylhexyltriazone.

14. The method of claim 1, further comprising removing the portion of the photosensitive adhesive layer overlapping the light blocking film after the processing of the product substrate.

15. A method of manufacturing a semiconductor device, comprising:
forming a light blocking film configured to block first light within a first wavelength band on an edge region of an upper surface of a light-transmitting carrier substrate, the light blocking film having a first width;
forming a photosensitive adhesive layer curable by the first light on the upper surface of the light-transmitting carrier substrate to at least partially cover the light blocking film;
bonding a product substrate to the upper surface of the light-transmitting carrier substrate using the photosensitive adhesive layer;
partially curing the photosensitive adhesive layer by irradiating the first light through the light-transmitting carrier substrate, wherein a portion of the photosensitive adhesive layer overlapping the light blocking film is not cured and adheres to the product substrate;
processing the product substrate to form a plurality of semiconductor devices, after the partially curing of the photosensitive adhesive layer, wherein the product substrate has a dummy region surrounding the plurality of semiconductor devices, the dummy region having a second width that is equal to or wider than the first width; and
cutting the plurality of semiconductor devices together with the product substrate, wherein the portion of the photosensitive adhesive layer overlapping the light blocking film is removed by the cutting.

16. The method of claim 15, wherein the product substrate comprises a frame having a first surface and a second surface opposite to each other, and having a plurality of through-holes, a plurality of semiconductor chips respectively in the plurality of through-holes, an encapsulant sealing the plurality of semiconductor chips, and a first redistribution structure on the first surface of the frame and having a first redistribution layer connected to one or more of the plurality of semiconductor chips, and
wherein the bonding of the product substrate comprises bonding the product substrate such that the first redistribution structure faces the photosensitive adhesive layer.

17. The method of claim 16, wherein the product substrate further comprises a passivation layer on the first redistribution structure and having an opening and an underbump metal layer in the opening of the passivation layer and connected to the first redistribution layer,
wherein the bonding of the product substrate comprises bonding the product substrate such that the passivation layer faces the photosensitive adhesive layer.

18. The method of claim 16, wherein the frame has a wiring structure connecting the first surface and the second surface, and
wherein the processing of the product substrate comprises forming a second redistribution structure having a second redistribution layer connected to the wiring structure on the second surface of the frame.

19. A method of manufacturing a semiconductor device, comprising:
forming a light blocking film configured to block first light within a first wavelength band on an edge region of an upper surface of a light-transmitting carrier substrate;
forming a photosensitive adhesive layer on the upper surface of the light-transmitting carrier substrate to at least partially cover the light blocking film;
bonding a product substrate to the upper surface of the light-transmitting carrier substrate using the photosensitive adhesive layer;
partially curing the photosensitive adhesive layer by irradiating the first light through the light-transmitting carrier substrate, wherein a portion of the photosensitive adhesive layer overlapping the light blocking film is not cured, but adheres to the product substrate;
processing the product substrate to form a plurality of semiconductor devices, after the partially curing of the photosensitive adhesive layer;
attaching adhesive tape to an upper surface of the product substrate on which the plurality of semiconductor devices are formed;
curing the portion of the photosensitive adhesive layer overlapping the light blocking film by irradiating second light having a second wavelength that is outside the first wavelength band through the light blocking film; and
detaching the product substrate from the light-transmitting carrier substrate.

20. The method of claim 19, further comprising cutting the plurality of semiconductor devices together with the product substrate, after the detaching of the product substrate.

\* \* \* \* \*